US012772545B2

(12) United States Patent
Prechtl et al.

(10) Patent No.: US 12,772,545 B2
(45) Date of Patent: Oct. 20, 2026

(54) SEMICONDUCTOR DEVICE AND METHOD OF FABRICATING A SEMICONDUCTOR DEVICE

(71) Applicant: Infineon Technologies Austria AG, Villach (AT)

(72) Inventors: Gerhard Prechtl, Rosegg (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 522 days.

(21) Appl. No.: 18/352,311

(22) Filed: Jul. 14, 2023

(65) Prior Publication Data

US 2024/0030217 A1 Jan. 25, 2024

(30) Foreign Application Priority Data

Jul. 21, 2022 (EP) .................................... 22186233

(51) Int. Cl.
*H10D 84/80* (2025.01)
*H10D 8/01* (2025.01)
(Continued)

(52) U.S. Cl.
CPC ........... *H10D 84/811* (2025.01); *H10D 8/051* (2025.01); *H10D 8/60* (2025.01); *H10D 30/015* (2025.01);
(Continued)

(58) Field of Classification Search
None
See application file for complete search history.

(56) References Cited

U.S. PATENT DOCUMENTS 6,097,046 A * 8/2000 Plumton .............. H10D 10/021 257/E29.189
2009/0078964 A1* 3/2009 Briere ................ H10D 30/4755 257/E29.091
2011/0254056 A1* 10/2011 Machida ............ H10D 30/4755 257/195
2013/0240911 A1* 9/2013 Beach .................. H10D 30/475 257/77
(Continued)

FOREIGN PATENT DOCUMENTS

WO 2013024752 A1 2/2013

OTHER PUBLICATIONS

Remashan, K., et al., "Simulation and fabrication of high voltage AlGaN/GaN based Schottky diodes with field plate edge termination", Microelectronic Engineering, vol. 84, Issue 12, Dec. 2007, pp. 2907-2915.

(Continued)

*Primary Examiner* — Bilkis Jahan
(74) *Attorney, Agent, or Firm* — Murphy, Bilak & Homiller, PLLC

(57) ABSTRACT

In an embodiment, a semiconductor device is provided that includes a Group III nitride transistor device and a Schottky barrier diode integrated in a Group III nitride body. A common drain/cathode finger is arranged on the Group III nitride body. Two or more source contacts are arranged on the Group III nitride body and spaced apart in a row, the row being spaced laterally apart from, and extending substantially parallel to, the common drain/cathode finger. A gate electrode structure and one or more Schottky metal contacts are arranged on the Group III nitride body. At least one Schottky metal contact is arranged between and spaced apart from neighbouring ones of the source contacts. The gate electrode structure includes a closed ring section for each source contact that laterally surrounds that source contact.

(Continued)

Neighbouring closed ring sections are connected by a gate connection section.

18 Claims, 17 Drawing Sheets

(51) Int. Cl.

| | |
|---|---|
| ***H10D 8/60*** | (2025.01) |
| ***H10D 30/01*** | (2025.01) |
| ***H10D 30/47*** | (2025.01) |
| ***H10D 64/00*** | (2025.01) |
| ***H10D 64/23*** | (2025.01) |
| ***H10D 64/27*** | (2025.01) |
| *H10D 62/10* | (2025.01) |

(52) U.S. Cl.

CPC ......... *H10D 30/475* (2025.01); *H10D 64/112* (2025.01); *H10D 64/258* (2025.01); *H10D 64/512* (2025.01); *H10D 64/519* (2025.01); *H10D 62/106* (2025.01)

(56) References Cited

U.S. PATENT DOCUMENTS

| | | | | |
|---|---|---|---|---|
| 2015/0137135 | A1* | 5/2015 | Green .................. | H10D 30/015 438/237 |
| 2016/0035719 | A1* | 2/2016 | Kanechika ........... | H10D 30/015 257/195 |
| 2017/0018617 | A1* | 1/2017 | Xia .......................... | H10D 1/66 |
| 2017/0358495 | A1* | 12/2017 | Jiang .................... | H10D 30/015 |

OTHER PUBLICATIONS

Zhang, Li, et al., “700-V p-GaN Gate HEMT with Low-Voltage Third Quadrant Operation Using Area-Efficient Built-in Diode”, ISPSD, Proceedings of the 2020 32nd International Symposium on Power Semiconductor Devices and ICs, Vienna, Austria, Sep. 13-18, 2020, pp. 521-524.

* cited by examiner

SEMICONDUCTOR DEVICE AND METHOD OF FABRICATING A SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

In order to allow a Group III nitride-based transistor device to operate at high speed, a Schottky barrier diode (SBD) may be included. US 2016/0035719 A1 discloses a normally off HEMT (High Electron Mobility Transistor) and Schottky barrier diode which are fabricated on a common nitride semiconductor substrate. However, further improvements to a semiconductor device including a Group III nitride transistor device and a Schottky barrier diode are desirable in order to improve performance and to simplify fabrication of the device.

SUMMARY

According to the invention, a semiconductor device is provided that comprises a Group III nitride transistor device and a Schottky barrier diode integrated in a Group III nitride body. The semiconductor device further comprises a common drain/cathode finger arranged on the Group III nitride body and two or more source contacts that are arranged on the Group III nitride body and spaced apart in a row, the row being spaced laterally apart from, and extending substantially parallel to, the common drain/cathode finger. The semiconductor device further comprises a gate electrode structure arranged on the Group III nitride body and one or more Schottky metal contacts arranged on the Group III nitride body. At least one Schottky metal contact is arranged between and spaced apart from neighbouring ones of the source contacts. The gate electrode structure comprises a closed ring section for each source contact that laterally surrounds that source contact. Neighbouring closed ring sections are connected by a gate connection section.

As a Schottky metal contact is arranged between and spaced apart from neighbouring ones of the source contacts, alternate Group III nitride transistor sections and Schottky barrier diode sections are formed along the length of the semiconductor device that extends parallel to the common drain/cathode transistor. The semiconductor device can be considered to have an interrupted source finger formed of a plurality of discrete sections with a Schottky barrier diodes formed in the gap between sections of the source finger. The arrangement of the transistor sections and Schottky barrier diode sections can be considered to be interdigitated.

In some embodiment, the transistor device is a HEMT (high Electron Mobility Transistor) and in some embodiments is an enhancement mode HEMT.

In some embodiments, the gate connection section is arranged on the Group III nitride body and is in direct contact with the Group III nitride body. This arrangement is useful in that the gate electrode structure is formed in a single plane and is simpler to manufacture.

In some embodiments, the gate connection section is arranged in a different plane to the plane in which the closed rings sections are positioned. The gate connection structure may be arranged in a plane that is positioned above and spaced apart from the first major surface of the Group III nitride body. This arrangement may be used so that a single Schottky contact can form a Schottky barrier diode with two drain/cathode fingers arranged on two opposing lateral sides of the Schottky contact.

In some embodiments, the source contacts are electrically coupled to one another and to the Schottky metal contacts by an ohmic metal layer. In some embodiments, the source contacts and Schottky metal contacts are formed separately from the ohmic metal layer and may be electrically connected to the ohmic metal layer by one or more conductive vias.

In some embodiments, the source contacts are integral with the ohmic metal layer. The ohmic metal layer has sections that are positioned on the first surface to form the row of two or more source contacts to the Group III nitride body, extends over the gate structure and onto the one or more Schottky metal contacts. Therefore, the ohmic metal layer forms the source contact and provides the lateral electrical connection between these source contacts and the Schottky metal contacts.

In some embodiments, the Schottky contact is arranged on the Group III nitride body laterally between the gate connection section and the common drain/cathode finger.

In some embodiments, the gate connection section is aligned with the row of source contacts and the Schottky metal contact is laterally displaced from the row towards the common drain/cathode finger. In embodiments in which the row of source contacts is arranged along the centreline of two cells and forms a source contact that is common to both cells, the Schottky metal contact is laterally displaced or offset from the centreline in the direction of the common drain/cathode finger.

In some embodiments, the gate connection section is laterally displaced from the row of source contacts towards the common drain/cathode finger and the Schottky metal contact is aligned with the row. In embodiments in which the row of source contacts is arranged along the centreline of two cells and forms a source contact that is common to both cells, the gate connection section is laterally displaced or offset from the centreline and the Schottky contact is arranged on the centreline.

In some embodiments, the gate connection section and the Schottky metal contact are laterally displaced from the row of source contacts towards the common drain/cathode finger. In embodiments in which the row of source contacts is arranged along the centreline of two cells and forms a source contact that is common to both cells, the gate connection section and the Schottky contact are laterally displaced or offset from the centreline. The gate connection section and the Schottky contact may be laterally displaced or offset from the centreline in opposing directions, i.e., are displaced from the centreline on opposing sides of the centreline.

In some embodiments, two Schottky contacts are positioned on opposing sides and laterally spaced apart from the gate connection section. The gate connection section may be arranged on the centreline and aligned with the row of source contacts in this embodiment. In this embodiment, two neighbouring cells include a Schottky barrier diode that are aligned with one another in a direction that is perpendicular to the length of the common drain/cathode finger. In embodiments in which the row of source contacts and the gate connection sections are arranged along the centreline of two cells so that the source contact forms a source contact that is common to both cells, the two Schottky contacts are laterally displaced or offset from the centreline. The two Schottky contacts are laterally displaced or offset from the centreline in opposing directions, i.e. are displaced from the centreline on opposing sides of the centreline.

In some embodiments, two or more Schottky contacts are provided and neighbouring Schottky contacts are arranged adjacent neighbouring gate connection sections and on opposing sides of the row of source contacts, for example on opposing sides of the centreline on which the source contacts are positioned.

According to the invention, a semiconductor device comprising a Group III nitride transistor device and a Schottky barrier diode integrated in a Group III nitride body is provided. The semiconductor device comprises a common drain/cathode finger arranged on the Group III nitride body, a gate electrode structure arranged on the Group III nitride body, an ohmic metal layer that has two or more sections that are positioned on the Group III nitride body and are spaced apart in a row that is laterally spaced apart and extend substantially parallel to the common drain/cathode finger, each section forming a source contact to the Group III nitride body and one or more Schottky metal contacts, at least one Schottky metal contact being arranged on the Group III nitride body between and spaced apart from neighbouring ones of the source contacts so as to form alternate Group III nitride transistor sections and Schottky barrier diode sections. The ohmic layer further extends over and is electrically insulated from the gate electrode structure and extends onto the Schottky metal contacts so as to electrically couple the two or more source contacts and the one or more Schottky contacts to one another.

This embodiment may be used for a transistor device structure having an elongate strip-like gate finger that extends parallel to the common drain/cathode finger and which does not have closed ring sections. The ohmic metal layer forms the source contacts of the transistor sections and also provides the lateral electrical connection between these source contacts and the Schottky contacts.

In some embodiments, the ohmic metal layer has a lateral extent that is greater than a lateral extent of the source contacts such that the ohmic metal layer further forms a field plate. In some embodiments, a distance between the field plate and the common drain/cathode finger is less than the shortest distance between the gate structure and the common drain/cathode finger. In other words, the distance between the peripheral edge of the ohmic metal layer that faces towards a drain/cathode finger and the peripheral edge of the drain/cathode finger that faces towards the ohmic metal layer is less that the shortest distance between the peripheral edge of a portion of the gate electrode structure that is closest to the drain/cathode finger and the peripheral edge of the drain/cathode finger that faces towards the gate electrode structure.

In some embodiments, the Schottky metal contact further comprises a field plate that extends over and is electrically insulated from the gate electrode structure.

In some embodiments, the semiconductor device further comprises an isolation region arranged in the gate electrode structure between neighbouring source and Schottky contacts. The isolation region may be an implanted region so that the isolation region comprises a disrupted or damaged crystal structure that may comprise implanted species.

In some embodiments, the gate electrode structure comprises a p-doped Group III nitride layer arranged on the Group III nitride body and a gate metal layer arranged on the p-doped Group III nitride layer. This embodiment may be used to provide an embankment mode transistor device which is normally off. The gate metal may be formed of a metal that forms an ohmic contact to the p-doped Group III nitride layer or a Schottky contact to the p-doped Group III nitride layer, for example TiN. In some embodiments, the p-doped Group III nitride layer is p-doped GaN.

In some embodiments, a region of the p-doped Group III nitride layer positioned between neighbouring source and Schottky contacts comprises an implanted region with a damaged crystal structure, i.e. a discrete localised region with a damaged crystal structure. This damaged region can be formed by implantation and may comprise implanted species and/or an irregular crystal structure. This damage or interruption to the crystal structure prevents the formation of the two-dimensional charge gas formed at the heterojunction between the Group III nitride channel and barrier layers of the HEMT in this region. In some embodiments, the implanted region has a depth from the first major surface that is greater than a depth of the heterojunction between the Group III nitride channel and barrier layers from the first surface so as to locally interrupt the two-dimensional charge gas.

In some embodiments, the gate electrode structure comprises a recessed gate structure and in some embodiments the p-doped Group III nitride layer is arranged in the recess. A recessed gate structure may be used to form an enhancement mode transistor device.

In some embodiments, a semiconductor device is provided that comprises a plurality of cells that are electrically coupled in parallel, each cell comprising a drain finger, a source structure and a gate structure. The cells may be electrically coupled in parallel, for example by a drain bus, source bus and gate bus. One or more of the cells comprises the semiconductor device of any one of the embodiments described above and has an interrupted source finger and a plurality of transistor sections and a plurality of Schottky barrier diode sections. In some embodiments, all of the cells comprise the semiconductor device of any one of the embodiments described above and have an interrupted source finger and a plurality of transistor sections and a plurality of Schottky barrier diode sections.

In some embodiments, one or more of the cells, which each comprising a drain finger, a source structure and a gate structure, comprises a source structure which has an uninterrupted source finger. The source finger is, therefore, continuous. This cell or these cells do not include a Schottky barrier diode and provides only a transistor device. Both types of cells are electrically coupled in parallel, for example by a drain bus, source bus and gate bus.

The number of cells with a transistor device and Schottky barrier diode and their distribution amongst cells having a transistor device and no Schottky barrier diode may vary and may be selected depending on the desired rating of the Schottky barrier diode in relation to the rating of the transistor device provided by the transistor device sections of the cells with an interrupted source finger and the transistor devices formed by the cells having an uninterrupted source finger.

According to the invention, a method of fabricating a semiconductor device is provided. The method comprises providing a Group III nitride body and at least one gate electrode structure on the Group III nitride body, forming an insulation layer over the gate electrode structure, forming one or more first openings and two or more second openings through the insulation layer that expose the Group III nitride body, the first and second openings being laterally spaced apart from the gate electrode structure and arranged alternately in a direction parallel to the gate electrode structure, forming a Schottky metal layer in the first opening to form a Schottky contact to the Group III nitride body; and forming an ohmic metal layer in the second openings to form ohmic source contacts to the Group III nitride layer and further forming the ohmic metal layer on the insulation layer and on the Schottky metal layer in the first opening to electrically connect the Schottky contact and the source contacts.

In some embodiments, the Schottky metal is selectively deposited in the first openings.

In some embodiments, the method further comprises, before forming the ohmic metal layer, forming the Schottky metal layer in the second openings and on the insulation layer and removing the Schottky metal layer from the second openings and exposing the first surface.

In some embodiments, the method further comprises forming one or more third openings in the insulating layer and exposing the first surface, wherein the third opening is laterally spaced apart from the first and second openings and the second and third openings are arranged on opposing sides of the gate electrode structure. The ohmic metal layer is further formed in the third opening to form an ohmic drain/cathode contact to the Group III nitride body.

In some embodiments, the method further comprises, before forming the ohmic metal layer, forming the Schottky metal layer in the third openings and removing the Schottky metal layer from the third openings to expose the first surface.

In some embodiments, the method further comprises forming a further insulation layer in the first openings and on the insulation layer, forming a fourth opening in the first opening that has a lateral extent that is less than the lateral extent of the first opening and that exposes the first surface, and afterwards forming the Schottky metal layer in the fourth openings and on the further insulation layer to form a Schottky contact to the Group III nitride body that comprises a field plate structure.

In some embodiments, the gate finger comprises closed ring-shaped sections that are connected by a gate connection section. One second opening for a source contact is formed within each ring-shaped section and the first opening for the Schottky contact is formed laterally adjacent the gate connection section.

In some embodiments, ohmic metal layer, the source contacts and the drain/cathode finger have a multilayer structure, for example Ti, Al and a capping metal such as Ti.

In some embodiments, the Schottky metal contacts are formed of one or more of TiN, Ti, W, $WSi_x$, Ta, TaN, Ni, Pd, Pt and Ir.

In some embodiments, the gate metal is formed of TiN.

In some embodiments, the Group III nitride body comprises a multilayer structure. In some embodiments, the multilayer structure comprises a channel layer, e.g. GaN and a barrier layer, e.g. AlGaN, on the channel layer which forms a heterojunction therebetween which supports a two-dimensional charge gas such as a two-dimensional electron gas (2DEG). In some embodiments, the barrier layer forms the first major surface of the Group III nitride body.

In some embodiments, the Group III nitride body is arranged on a substrate which comprises an upper or growth surface which is capable of supporting the epitaxial growth of one or more Group III nitride-base layers. In some embodiments, the common substrate is a foreign substrate, i.e. is formed of a material other than Group III nitride materials that includes the upper or growth which is capable of supporting the epitaxial growth of one or more Group III nitride-base layers. The common foreign substrate may be formed of silicon and may be formed of monocrystalline silicon or an epitaxial silicon layer, for example, or sapphire.

In some embodiments, a buffer structure is formed on the growth surface of the substrate and the channel layer is arranged on the buffer structure. In some non-illustrated embodiments, the Group III nitride-based semiconductor body further comprises a back barrier layer and the channel layer is formed on the back barrier layer and forms a heterojunction with the back barrier layer and the barrier layer is formed on channel layer. The back barrier layer may have a different bandgap to the channel layer and may comprise AlGaN, for example. The composition of the AlGaN of the back barrier layer may differ from the composition of the AlGaN used for the barrier layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1A illustrates a top view, FIG. 1B illustrates a cross-sectional view along the line A-A shown in FIG. 1A, and FIG. 1C illustrates a cross-sectional view along the line B-B shown in FIG. 1A.

FIG. 3A illustrates a top view, FIG. 3B a cross-sectional view along the line A-A shown in FIG. 3A, and FIG. 3C a cross-sectional view according to another embodiment.

FIG. 4A illustrates a plan view, FIG. 4B illustrates a cross-sectional view along line B-B shown in FIG. 4A, FIG. 4C illustrates a cross-sectional view along line C-C shown in FIG. 4A, FIG. 4D illustrates a top view of a semiconductor device according to an alternative embodiment, and FIG. 4E illustrates a cross-sectional view along the line C-C shown in FIG. 4A of an alternative embodiment.

FIG. 7A illustrates a top view of the transistor device, FIG. 7B illustrates a cross-sectional view along the line D-D, FIG. 7C illustrates a cross-sectional view along the line E-E, and FIG. 7D illustrates a cross-sectional view along the line F-F.

DETAILED DESCRIPTION

Figure 1A:
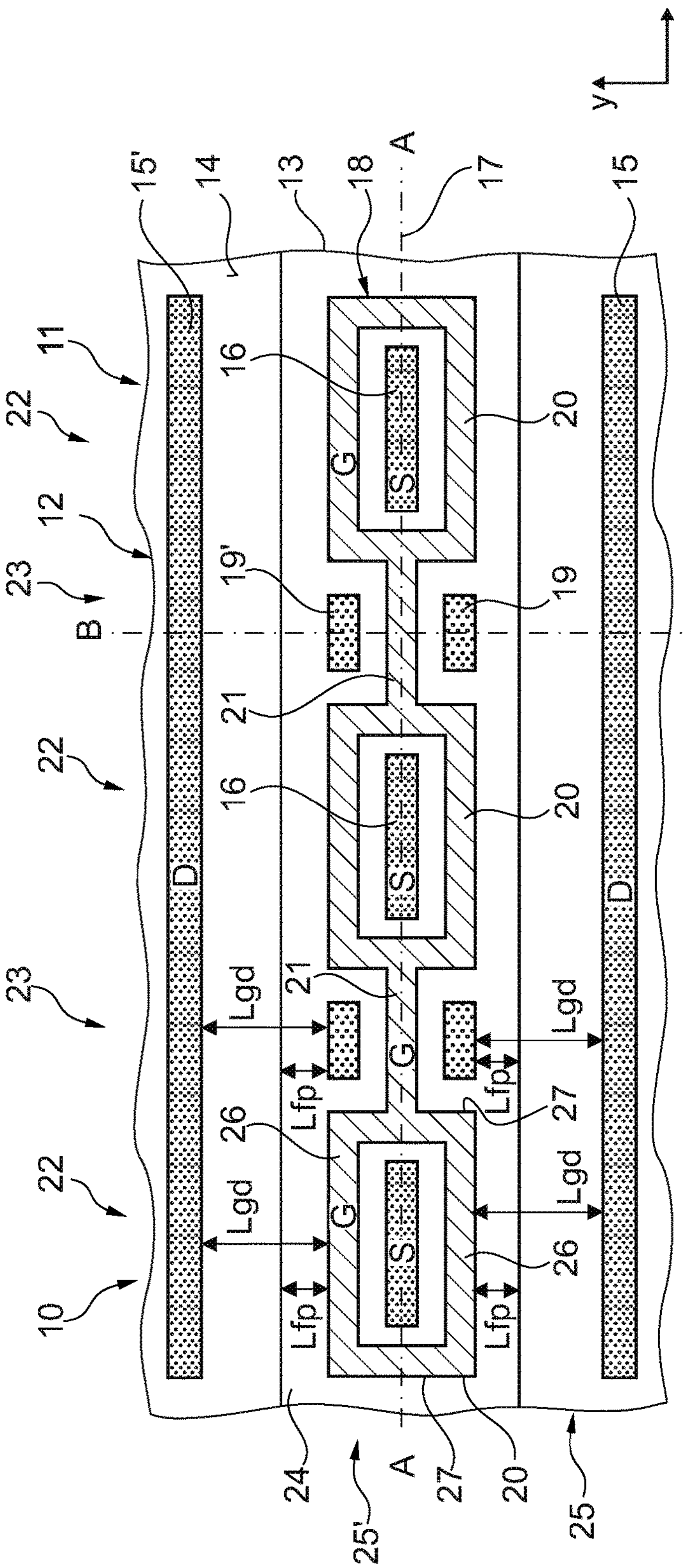
FIGS. 1A to 1C illustrate a semiconductor device with a transistor device and Schottky barrier diode, where

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as an enhancement mode transistor has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

Enhancement mode power HEMTs including a p-GaN gate structure with good performance can be produced. However, due to the inherent lack of body diode, the reverse conduction voltage (VRC) of such HEMTs is dependent on the threshold voltage (VTH) and the OFF-state gate bias (VGS). The VTH of a p-GaN gate HEMT is typically higher than the turn-on voltage of a silicon diode, and the dynamic VTH shift during the switching operation makes the situation even more complicated. To suppress a false turn-on of the transistor in high-frequency applications, a negative gate voltage may be used to turn-off the device, which further increases the reverse conduction loss.

Several methods have been proposed to address the above issue in GaN power transistors, including stringent dead time control or an external Schottky barrier. These approaches add to system cost and design complexity. Embedding a Schottky contact in the drain-side access region could in principle be used to improve reverse conduction capability. However, such structures typically exhibit relatively large OFF-state leakage current due to the high electric field exists around the edge of the Schottky contact.

Herein, an interdigitated GaN-based Schottky barrier diode (SBD)/transistor structure is provided in order to obtain a superior reverse conduction capability without severely sacrificing the forward RON, i.e. with a good trade-off between the forward and reverse conduction. In contrast to the conventional pGaN gate HEMT whose VRC is dependent on VTH and OFF state VGS, a low VRC is obtained even with a negative VGS. Furthermore, the semiconductor device exploits the access region (i.e. drift region) in both forward conduction and reverse conduction, and is therefore, much more area-effective compared to the two-device solution using a side-by-side transistor/diode pair.

In some embodiments, a continuous gate routing is provided without needing an additional metal layer to connect discrete gate islands. Since an interrupted gate construction is avoided, an extra gate metal is avoided. A self-aligned gate metal stack can also be used to achieve small gate length, as it is common for low voltage GaN HEMTs, since an additional metal layer for the connection is unnecessary. The non-interrupted gate connection allows a process and space optimized GAN HEMT design. A Schottky barrier diode (SBD) integration with a process and space optimized transistor design is provided, also for low voltage GaN Transistors. The proposed concept is also applicable for HV transistor designs with similar advantages if a self-aligned gate process is used.

Additionally, a gate metal that is used as a field plate is avoided, since a gate connected field plate can provide large contribution to Cgd. In some embodiments, a source connected field plate can also be included. The source connected field plate is advantageous because Cgd is not affected as it would be by a gate connected field plate. In some embodiments, the field plate for the Schottky diode is longer than for the corresponding HEMT. This will lead to a very low electrical field at the Schottky contact edge towards the drain contact. With this integration concept the ohmic metal can also be used as a source connected field plate, leading to an improved FoM as compared to a gate connected field plate concept. An alternating contact for the Schottky diode and the ohmic metal is provided and this contact sequence can be obtained within the same metal layer.

In some embodiments, the Schottky contact placement can be designed that the field plate for the Schottky barrier diode has a length Lfp that is greater or equal to the length of the field plate Lfp for the HEMT. With this design electric fields at the Schottky contact edge towards the drain are similar to the electrical field at the HEMT gate edge towards the drain.

In some embodiments, the gate includes a p-doped Group III nitride, e.g. GaN, layer between the gate metal and the Group III nitride barrier layer. This arrangement may be used to form an enhancement mode device. In some embodiments, pGaN process damage implantation is used for isolation regions. These implants can also be placed on the pGaN gate regions, which leads than to isolated pGaN structures. In some embodiments, the pGaN regions around the Schottky contact were made inactive by damage implantation. With this embodiment, a possible leakage path between the pGaN Gate and the Schottky contact can be suppressed. In some embodiments, the damage implantation also extends into the 2DEG region between the Schottky contact and the inactive pGaN gate.

Figure 1B:
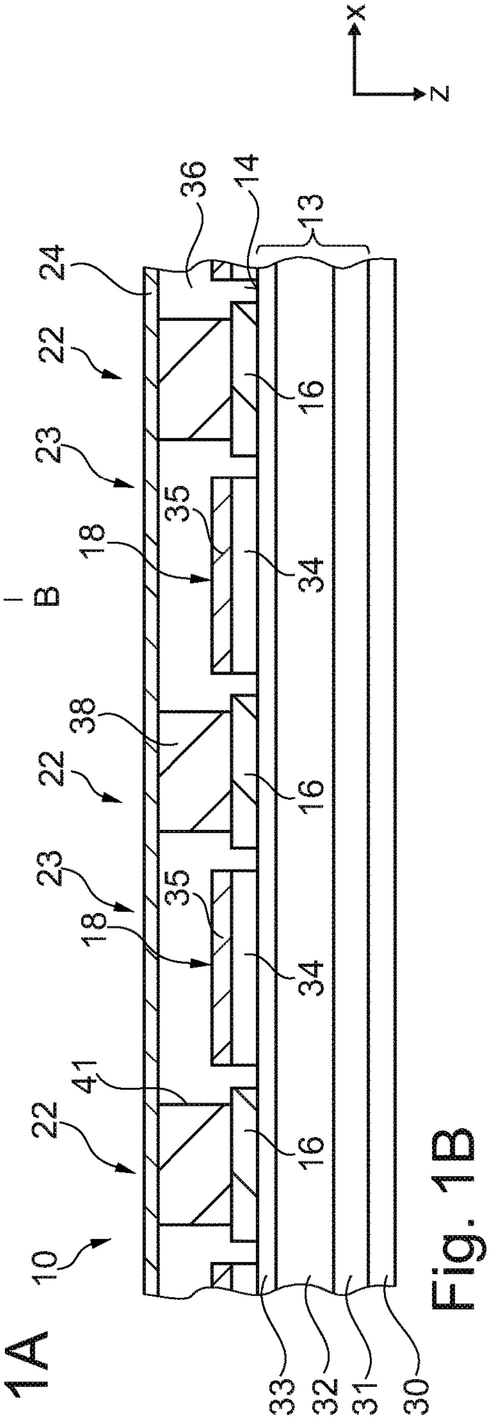
Figure 1C:
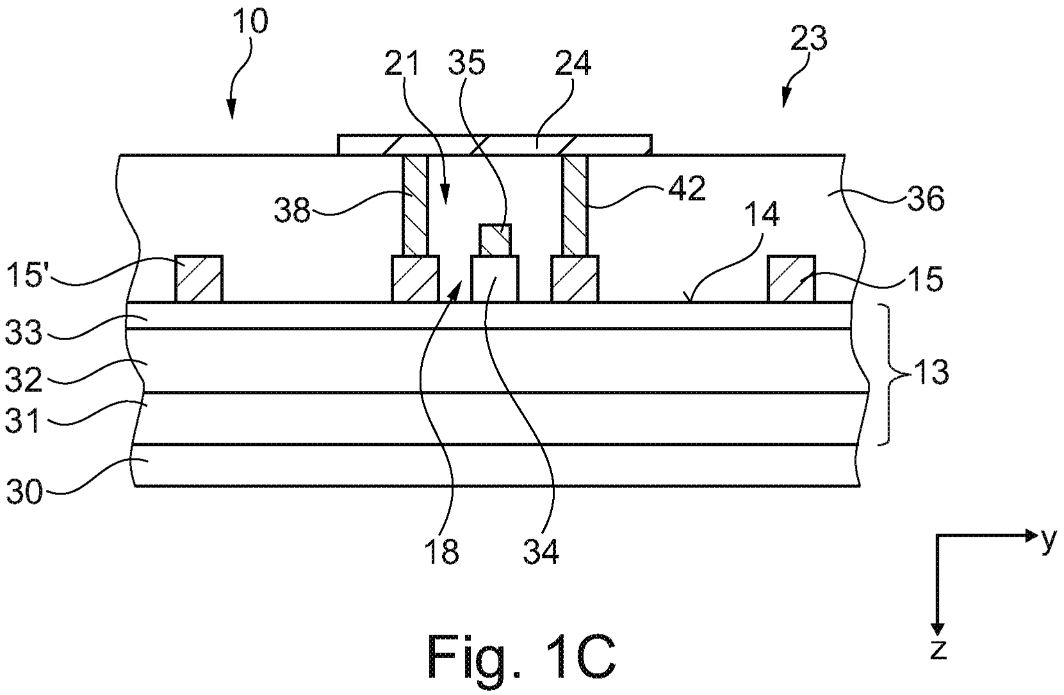

FIG. 1A illustrates a top view of a semiconductor device 10 comprising a Group III nitride transistor device 11 and a Schottky barrier diode 12, FIG. 1B illustrates a cross-sectional view along the line A-A, and FIG. 1C a cross-sectional view along the line B-B shown in FIG. 1A.

The Group III nitride transistor device 11 and the Schottky barrier diode 12 are Integrated in a common Group III nitride body 13 which has a first major surface 14. The semiconductor device 10 comprises a common drain/cathode finger 15 arranged on the Group III nitride body 13 and one or more source contacts 16 that are arranged on the Group III nitride body 13 and spaced apart in a row. The drain/cathode finger 15 is elongate and has a stripe form. The row of source contacts 16 is laterally spaced apart from and extends substantially parallel to the common drain/cathode finger 15. The individual ones of the source contacts 16 may have an elongate stripe-like form with the longer dimension of the stripe extending substantially parallel to the common drain/cathode finger 15 and length of the row. The transistor device 11 may be a high Electron Mobility Transistor (HEMT).

Using the Cartesian coordinate system, in the view illustrated in FIGS. 1A through 10, the longest dimension of the drain/cathode finger 15 and of the row of source contacts 16 can be considered to extend in the X direction. The source contacts 16 are laterally spaced apart from the drain/cathode finger 15 in a perpendicular direction to the length of the row and in the Y direction using the Cartesian coordinate system.

A gate electrode structure 18 and one or more Schottky metal contacts 19 are also arranged on the Group III nitride body. At least one Schottky metal contact 19 is arranged between and spaced apart from neighbouring ones of the source contacts 16.

The gate electrode structure 18 comprises a closed ring section 20 for each source contact 16. Each individual closed ring section 20 laterally and continuously surrounds one source contact 16 and is laterally spaced apart from the source contact 16. In some embodiments, each closed ring section 20 includes two side portions 26 extending in the X direction which are connected by two side portions 27 extending in the Y direction so as to form a substantially rectangular closed ring section. Since two or more source contacts 16 are provided, the same number of closed ring sections 20 is provided.

In some embodiments, such as that illustrated in FIGS. 1A through 10, neighbouring closed ring sections 20 of the gate electrode structure 18 are connected by a gate connection section 21 which is arranged on and in direct contact with the Group III nitride body 13. The gate connection section 21 extends between neighbouring closed ring sections 20. In some embodiments, the gate connection section 21 is integral with the two neighbouring closed ring sections 20.

Since the closed ring section 20 of the gate electrode structure laterally surrounds the source contact 16, portions of this closed ring section 20 are positioned between the source contact 16 and the drain/cathode finger 15 such that this section of the semiconductor device 10 provides a Group III nitride transistor section 22. A portion of the gate electrode structure 18 is, however, not positioned laterally between the Schottky metal contact 19 and the drain/cathode finger 15. Therefore, this section of the semiconductor device provides a Schottky barrier diode section 23. The Group III nitride transistor sections 22 and Schottky barrier diode sections 23 are arranged alternately in the X direction. The Group III nitride transistor sections 22 are electrically coupled in parallel to form the Group III nitride transistor 11 and the Schottky barrier sections 23 are electrically coupled in parallel to form the Schottky barrier diode 12.

The source contact 16 and the drain/cathode finger 15 may each be formed of a material that forms an ohmic contact to the underlying Group III nitride body 13. In some embodiments, the source contact 16 and the drain/cathode finger 15 comprise Al. The source contacts 16 and the drain/cathode finger 15 may also have a multilayer structure, for example Ti, Al and a capping metal, e.g. TiN.

The Schottky metal contacts 19 are formed of a material which forms a Schottky contact to the underlining Group III nitride body 13 and may be formed of one or more of TiN, Ti, W, $WSi_x$, Ta, TaN, Ni, Pd, Pt and Ir.

In some embodiments, such as that illustrated in FIGS. 1A through 10, the gate electrode structure 18 forms a continuous conductive path on the first surface 14 of the Group III nitride body 13 which has an overall direction which is parallel to the drain/cathode finger 15. The gate electrode structure 18 is positioned in a single plane which simplifies manufacturing by reducing the number of processing steps compared to a multi-plane arrangement.

In some embodiments, the source contacts 16 are electrically coupled to one another and are electrically coupled to the Schottky metal contacts 19 by an ohmic metal layer 24. In some embodiments, the source contacts 16 and Schottky metal contacts 19 are pre-formed and each have the form of a metal island. The ohmic metal layer 24 may be formed as a separate layer which is deposited onto the preformed source contacts 16 and Schottky metal contacts 19. In other embodiments, as, for example illustrated and described with reference to FIG. 3C, the source contacts 16 are integral with the ohmic metal layer 24.

The ohmic metal layer 24 is positioned on the source contacts 16 and extends over the gate electrode structure 18 and onto the one or more Schottky contacts 19. The ohmic metal layer 24 is spaced apart and electrically insulated from the underlying gate electrode structure 21 but is positioned directly on and electrically connected to the source contacts 16 and Schottky metal contacts 19 in order to electrically couple the Schottky metal contacts 19 and the source contacts 16 together. Thus, the semiconductor device 10 has a plurality of Schottky barrier diode sections 23 that are electrically coupled in parallel between the source contact 16 and the drain/cathode finger 15 and that are electrically coupled in parallel with the transistor device sections 22.

The semiconductor device 10 includes a plurality of cells 25, 25' of which two are illustrated in FIGS. 1A through 10.

In the embodiment illustrated in FIGS. 1A through 10, the source contacts 16 provide a common source for the two adjoining cells 25, 25'. A second drain/cathode finger 15' is arranged on the opposing side of the source contact 16 to the first drain/cathode finger 15. Since the closed ring section 20 of the gate electrode structure 18 surrounds the source contact 16, it provides the gate electrode for both of the adjoining cells 25, 25'. The two cells 25, 25' have a mirror symmetrical arrangement about the centreline 17 that extends in the Y direction through the centre of the closed ring sections 20, the source contacts 16 and the gate connection sections 21. Each of the cells 25, 25' comprises a Group III nitride transistor device 11 provided by the plurality of transistor sections 22 and a Schottky barrier diode 12 provided by the plurality of Schottky barrier sections 23.

In some embodiments, such as that illustrated in FIGS. 1A through 10, the Schottky contact 19 is arranged on the Group III nitride body 13 laterally in the Y direction between the gate connection section 21 and the common drain/cathode finger 15. The distance between the Schottky metal contact 19 and the drain/cathode finger 15 in the Y direction is, therefore, greater than the distance between the gate connection section 21 and the drain/cathode finger 15 in the Y direction. A Schottky contact 19, 19' is arranged adjacent and spaced apart from the opposing sides of the gate connection section 21 in the Y direction.

In some embodiments, such as that illustrated in FIGS. 1A through 10, the gate connection section 21 is aligned with the row of source contacts 16 such that the source contact 16 and the gate connection sections 21 are arranged at substantially the same distance in the Y direction from the drain/cathode finger 15. In these embodiments, the Schottky metal contacts 19 are laterally displaced from the row towards the common drain/cathode finger 15 in the Y direction.

The ohmic metal layer 24 which is electrically connected to the source contacts 16 and the Schottky contacts 19, 19' which are positioned on opposing sides of the centreline 17 has a lateral extent such that it extends laterally beyond the Schottky contacts 19, 19' and the closed ring sections 20 of the gate electrode structure 18 in the Y direction. The ohmic metal layer 24 may have a stripe like form and have a lateral extent such that it extends beyond the Schottky contacts 19, 19' and closed ring sections 20 by distance Lfp and provides a source connected field plate. In this embodiment, the distance Lfp is the same for both the Schottky contact 19, 19' and the side portions 26 of the closed ring section 20 that face towards the common drain/cathode fingers 15, 15'.

The distance in the Y direction between the side portions 26 of the closed ring sections 20 and the common drain/cathode finger 15, 15' towards which it faces is denoted as a distance Lgd. The spacing between the Schottky contact 19, 19' and its respective common drain/cathode finger 15, 15' is also substantially the same as Lgd, in this embodiment.

The length of the individual source contacts 16 and the length of the individual Schottky contacts 19, the length being measured in a direction that extends parallel to the longest dimension of the common drain/cathode finger 15, and the ratio between the length of the source contact 16 and the length of the Schottky contact 19 may be selected so as to provide the desired ratio between the length of the Group III nitride transistor sections 22 and Schottky barrier diode sections 23.

FIG. 1B illustrates a cross-sectional view of the semiconductor device 10 along the line A-A and FIG. 1C illustrates a cross-sectional view of the semiconductor device 10 along the line B-B shown in FIG. 1A. The structure of the Group III nitride body 13 can be seen in the cross-sectional views. The Group III nitride body 13 has a multilayer structure and is arranged on a substrate 30. The Group III body comprises a buffer structure 31 on the substrate 30, a GaN channel layer 32 on the buffer layer and an AlGaN barrier layer 33 on the GaN channel layer 32 which forms a heterojunction therebetween which supports a two-dimensional charge gas such as a two-dimensional electron gas (2DEG). In this embodiment, the AlGaN barrier layer 33 forms the upper surface 14 of the Group III nitride body 13.

The substrate 30 includes an upper or growth surface which is capable of supporting the epitaxial growth of one or more Group III nitride-base layers. In some embodiments, the common substrate is a foreign substrate, i.e. is formed of a material other than Group III nitride materials that includes the upper or growth which is capable of supporting the epitaxial growth of one or more Group III nitride-base layers. The common foreign substrate 30 may be formed of silicon and may be formed of monocrystalline silicon or an epitaxial silicon layer, for example, or sapphire.

In some non-illustrated embodiments, the Group III nitride-based semiconductor body 13 may further include a back barrier layer. The channel layer 32 is formed on the back barrier layer and forms a heterojunction with the back barrier layer and the barrier layer 33 is formed on channel layer 32. The back barrier layer has a different bandgap to the channel layer and may comprise AlGaN, for example. The composition of the AlGaN of the back barrier layer may differ from the composition of the AlGaN used for the barrier layer 33.

A typical transition or buffer structure 31 for a silicon substrate includes a AlN starting layer, which may have a thickness of several 100 nm, on the silicon substrate followed by a $Al_xGa_{(1-x)}N$ layer sequence, the thickness again being several 100 mm's for each layer, whereby the Al content of about 50-75% is decreased down to 10-25% before the GaN layer or AlGaN back barrier, if present, is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

The source contacts 16 are arranged directly on the barrier layer 33 or can placed after recessing the barrier. The gate electrode structure 18 includes a p doped Group III nitride layer 34, for example p doped gallium nitride, and a gate metal layer 35 which is arranged on the p doped Group III nitride layer 34. This structure for the gate electrode structure 18 provides an enhancement mode device which is normally off. In other embodiments, the gate electrode structure 18 may have a recessed structure in addition to or in place of the p doped Group III nitride layer 34 to provide an enhancement mode device. In other non-illustrated embodiments, the p-doped Group III nitride layer is omitted and the gate electrode structure 18 includes a gate metal layer 35 only and provides a depletion mode device which is normally on.

An electrically insulating layer 36 is arranged on the upper surface 14 of the Group III nitride body 13 which covers the gate electrode structure 18 and which has openings 41, 42 which leave the source contacts 16 and Schottky contacts 19 exposed. The ohmic metal layer 24 is positioned on the insulating layer 36 so as to be spaced apart vertically and electrically insulated from the underlying gate electrode structure 18. The ohmic metal layer 24 is in contact with the source contacts 16 and the Schottky contacts 19 by way of conductive vias 38 which extend through the electrically insulating layer 36. The ohmic metal layer 24 extends between the vias 38 to electrically couple the source contacts 16 and Schottky contacts 19 to one another.

The vertical connection provided by the conductive via 38 between the ohmic metal layer 24 and the Schottky contacts 19, 19' that are arranged on the surface 14 of the Group III nitride body 13 on opposing sides of the gate connection section 21 in the Y direction can be seen in the cross-sectional view of FIG. 1C. The ohmic metal layer 24 is electrically insulated from the gate connection section 21 by the intervening electrically insulating layer 36. In some embodiments, such as that illustrated in FIG. 3C, the conductive vias 38 are integral with the ohmic metal layer.

Figure 2:
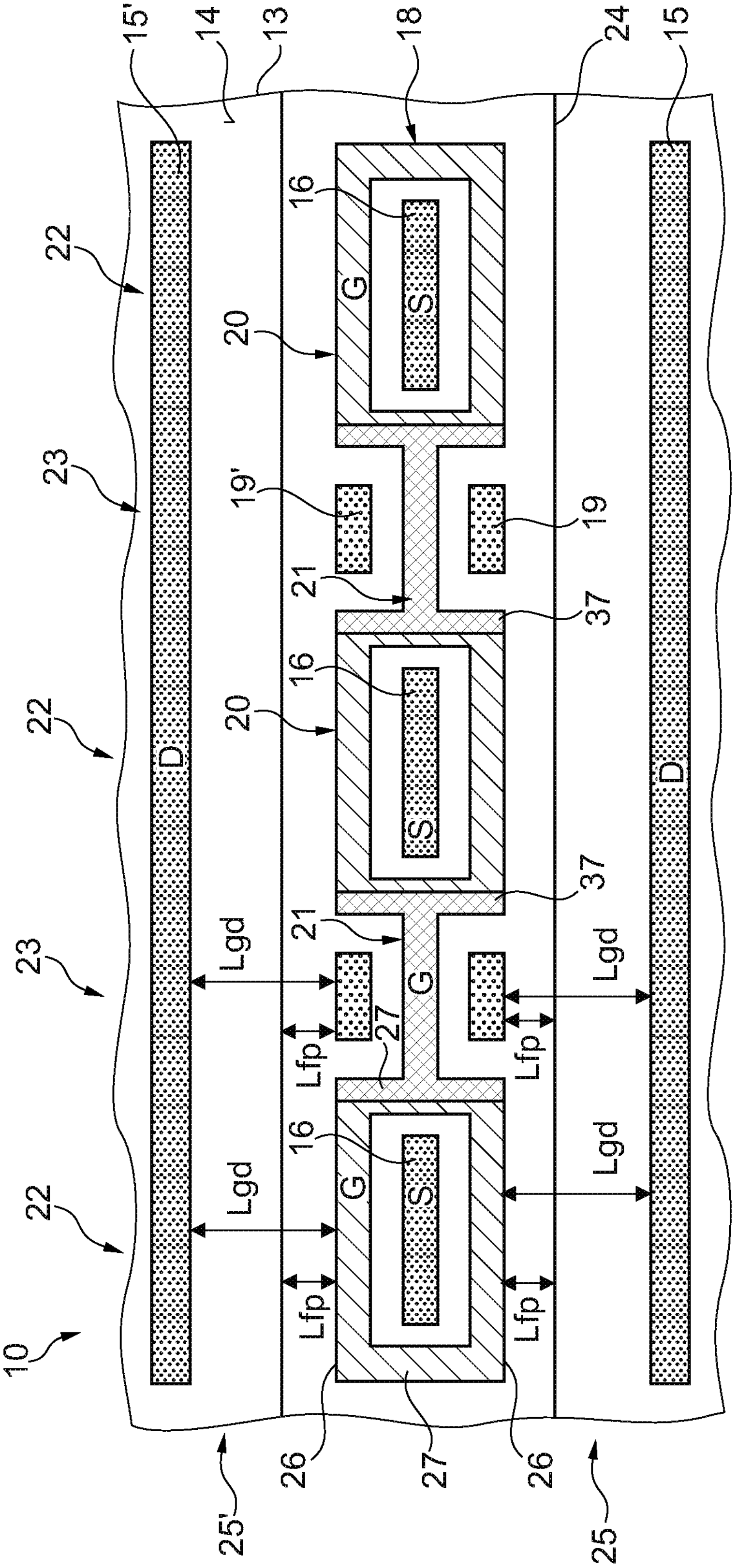
FIG. 2 illustrates a top view of a semiconductor device according to an embodiment.

FIG. 2 illustrates a top view of a semiconductor device 10 having alternate Group III nitride transistor sections 22 and Schottky barrier sections 23 which has a layout which corresponds to that illustrated in FIGS. 1A to 1C. The semiconductor device 10 comprises an isolation region 37 arranged between neighbouring source and Schottky contacts 16, 19.

In the embodiment illustrated in FIG. 2, the isolation region 37 is arranged in the gate electrode structure 18 between neighbouring source and Schottky contacts 16, 19. In particular, the p doped Group III nitride layer 34 of the gate electrode structure 18 which is positioned between the Schottky barrier diode sections 23 and neighbouring Group III nitride transistor sections 22 is damaged, for example by implantation of regions of the p doped Group III nitride layer 34. In some embodiments, at least a portion of the side portions 27 of neighbouring closed ring sections 20 are implanted and in other embodiments at least a portion of the side portions 27 of the neighbouring closed ring sections 20 and the gate connection section 21 extending between the side portions 27 are implanted. The gate metal layer 35 extends continuously on the surface of the Group III nitride body 13 throughout the closed rings sections 20 and gate connection sections 21 so as to provide a single conductive connection for the gate which extends uninterrupted along the length of the drain finger 15.

This damaged region may comprise implanted species and/or an irregular crystal structure. This damage or interruption to the crystal structure prevents the formation of the two-dimensional charge gas in this region. The implanted region 37 may have a depth from the first surface 14 that is greater than a depth of the heterojunction from the first surface 14 so as to locally interrupt the two-dimensional charge gas.

Figure 3A:
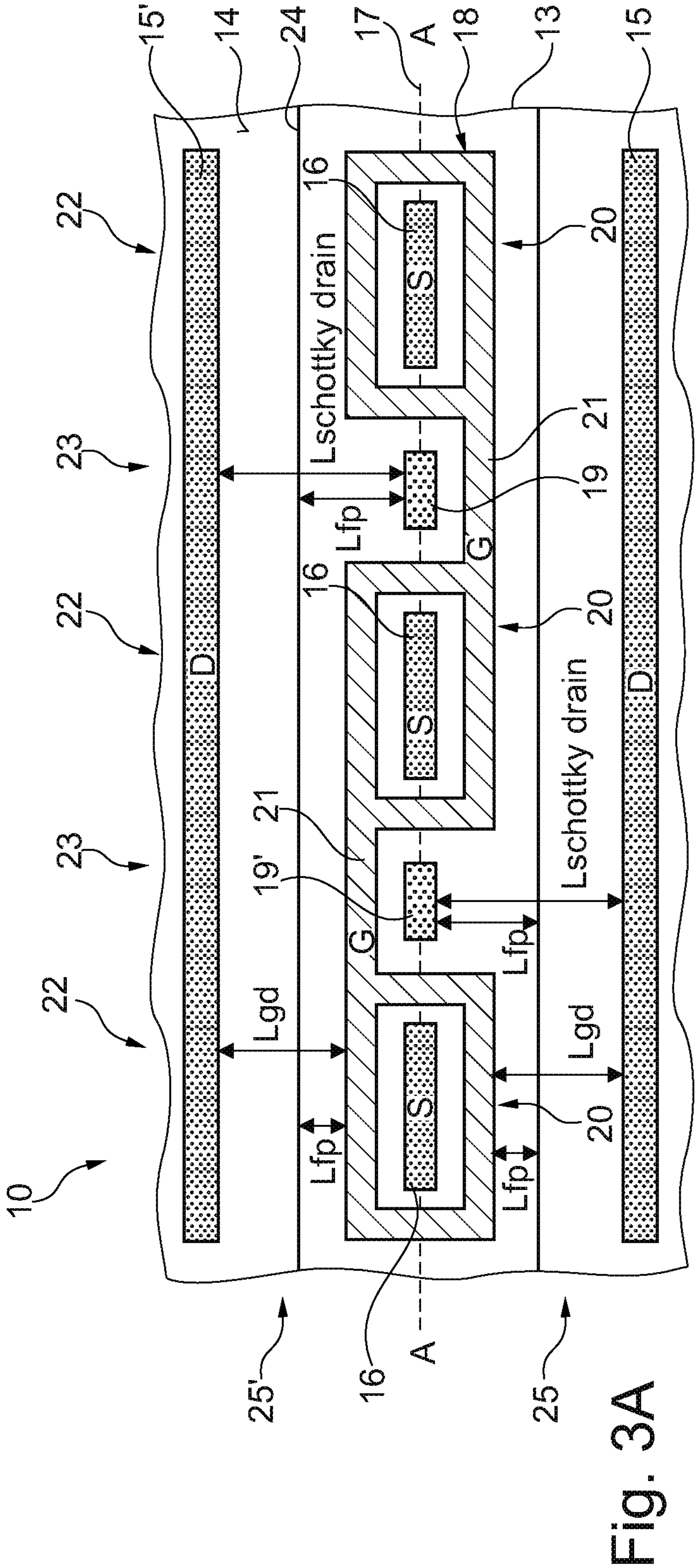
FIGS. 3A to 3C illustrate a semiconductor device according to an embodiment, where
Figure 3B:
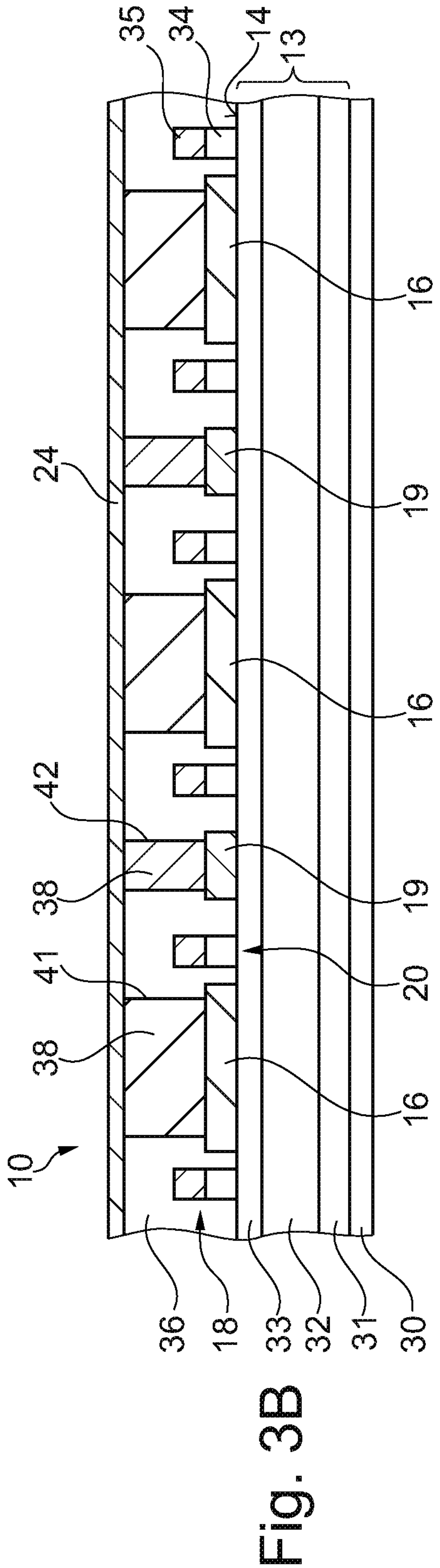

FIG. 3A illustrates a top view and FIG. 3B a cross-sectional view along the line A-A shown in FIG. 3A of a semiconductor device 10 and show two cells 25, 25' each having alternate Group III nitride transistor sections 22 and Schottky barrier sections 23 along the X-direction. Similar to the embodiment illustrated in FIGS. 1A-1C and 2, the semiconductor device 10 comprises two or more source contacts 16 which are spaced apart in the X direction in a row along the centreline 17 that is located between two parallel common drain/cathode fingers 15 arranged on the top surface 14 of the Group III nitride body 13 to form two cells 25, 25'. In contrast to the embodiments illustrated in FIGS. 1A-1C and 2, the Schottky contact 19 is arranged along the centreline 17 such that the distance in the Y direction between the Schottky contact 19 and the common drain/cathode finger 15 is substantially the same as the distance between the source contact 16 and the common drain/cathode finger 15. In this embodiment, the source contacts 16 and Schottky contacts 19 are common to both cells 25, 25'.

The gate electrode structure 18 comprises closed ring sections 20 that are arranged on the first surface 14 of the semiconductor body 13, one closed ring section 20 laterally surrounding each source contact 16. In this embodiment, the closed ring sections 20 are connected to one another by a gate connection region 21 which is arranged offset or displaced in the Y direction from the centreline 17. The gate connection section 21 may extend parallel to the centreline 17 and between side portions 26 of neighbouring ones of the closed ring sections 20. The gate connection section 21 is therefore positioned between the Schottky contact 19 and the common drain/cathode finger 15'. In the embodiment illustrated in FIGS. 3A through 3C, neighbouring ones of the gate connection sections 21 are arranged on opposing sides of the centreline 17 displaced in the Y direction. Thus, the first Schottky section 23 is formed between the Schottky contact 19 and the common drain/cathode finger 15 of the first cell 25 arranged on one side the centreline 17 and the next Schottky section 23 is formed between the Schottky contact 19' and the common drain/cathode finger 15' of the second cell 25' arranged on the opposing side of the centreline 17.

Since the Schottky contacts 19 are arranged on the centreline, the distance $L_{fp}$ between the edge of the Schottky contact 19 and the edge of the ohmic metal layer 24 for the Schottky sections 23 is greater than the distance $L_{fp}$ between the gate connection structure 18 and the edge of the ohmic metal layer 24 in the transistor sections 22. The distance $L_{Schottky\ drain}$ is also larger than the distance $L_{gd}$, in contrast to the embodiments of FIGS. 1A-1C and 2.

As can be seen in the cross-sectional view of FIG. 3B, the source contacts 16 are formed by a discrete metal island formed of metal that forms an ohmic contact to the Group III nitride body. Similarly, the Schottky contacts are formed by discrete metal island that is formed of a metal that forms a Schottky contact to the Group III nitride body 13. These metal islands are electrically coupled to the ohmic metal layer 24 by conductive vias 38 which extend through the electrically insulating layer 36. In some embodiments, the conductive vias 38 are integral with the ohmic metal layer 24.

Figure 3C:
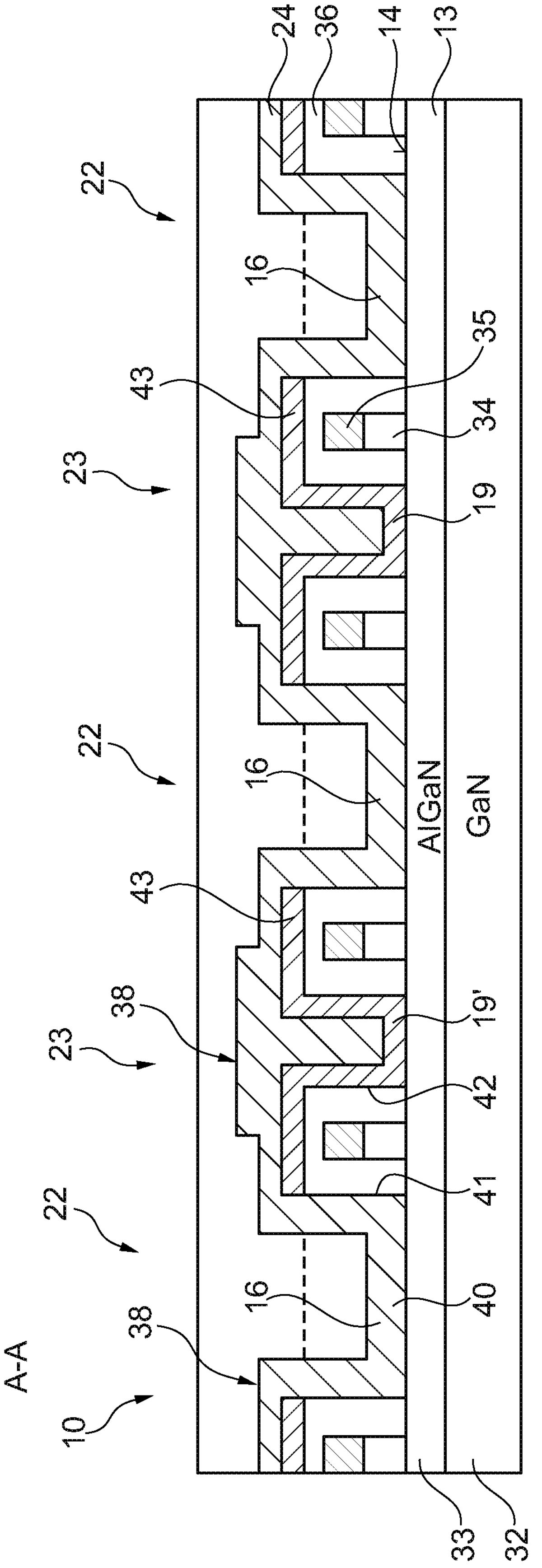

In some embodiments, the semiconductor device 10 includes a different arrangement of the source contacts 16 and/or Schottky contacts 19 which may be used in place of the discrete metal islands. Referring to FIG. 3C which illustrates a cross-section along the line A-A, the source contacts 19 are integral with the ohmic metal layer 24. The electrically insulating layer 36 has openings 41 which expose regions of the two-dimensional Group III nitride body 13 corresponding to the desired lateral size and position of the source contact. The metal layer 24 extends into the openings 41 and has sections 40 that are positioned on the first surface 13 and which form the row of two or more source contacts 16 to the Group III nitride body 13. The sections 40 may be in direct contact with, the Group III nitride body 13 and may be elongate having a long direction extending along the centreline 17 such that the contact area of the source contact 16 to the Group III nitride body 13 corresponds to that of the discrete metal islands of FIG. 3B. The ohmic metal layer 24 extends on the top surface of the insulating layer 36 and over the gate structure 18 and is electrically insulated from the underlying gate structure 18 by the electrically insulating layer 36. The electrically insulating layer 36 has openings 42 in which the Schottky contacts 19 are exposed. The ohmic metal layer 24 further extends into the openings 42 and onto the one or more Schottky contacts 19 so as to electrically connect the source contacts 16 and Schottky contacts 19 to one another.

The Schottky contact 19 may be formed of a discrete metal island formed on the top surface 14 of the Group III nitride body 13. In some embodiments, a metallic layer forms the Schottky contact 19 and also extends through the opening 42 in the electrically insulating layer 36 and over the top surface of the electrically insulating layer 36. This Schottky layer extends over the gate electrode structure 18 and is electrically insulated from the underlying gate electrode structure 18 by the electrically insulating layer 36.

This arrangement can be fabricated by first applying the electrically insulating layer 36 and then forming openings 41, 42 exposing regions of the Group III nitride body 13 at positions which are to form the source contacts 16 and Schottky contacts 19. The Schottky contact metal layer 43 may be formed in alternate ones of the openings, i.e. openings 42, to form the Schottky contacts 19 and then the ohmic metal layer 24 may be deposited, lining the openings 42 and covering the Schottky metal contacts 19 and also lining the openings 41, which are free of the Schottky metal, in order to form the ohmic source contact 16 to the Group III nitride body 13 and to electrically connect the Schottky metal layers 43 and contacts 19 to the ohmic contact layer 14 and the sections 40 of the ohmic metal layer 24 that form the source contacts 16. The sections of the ohmic metal layer 24 in the openings 41, 42 provide conductive vias 38.

In some embodiments, the Schottky metal layer 43 may be deposited such that it entirely covers the top surface of the electrically insulating layer 36 and lines the openings 42 for the Schottky contacts and also the openings 41 for the source contacts. The Schottky metal layer 43 is then selectively removed from the openings 41 for the source contacts before the ohmic metal layer 24 is deposited. The Schottky layer 43 can remain at the interface between the ohmic metal layer 24 and the electrically insulating layer 36, including the side walls of the openings 42 for the Schottky contacts 19.

Figure 4A:
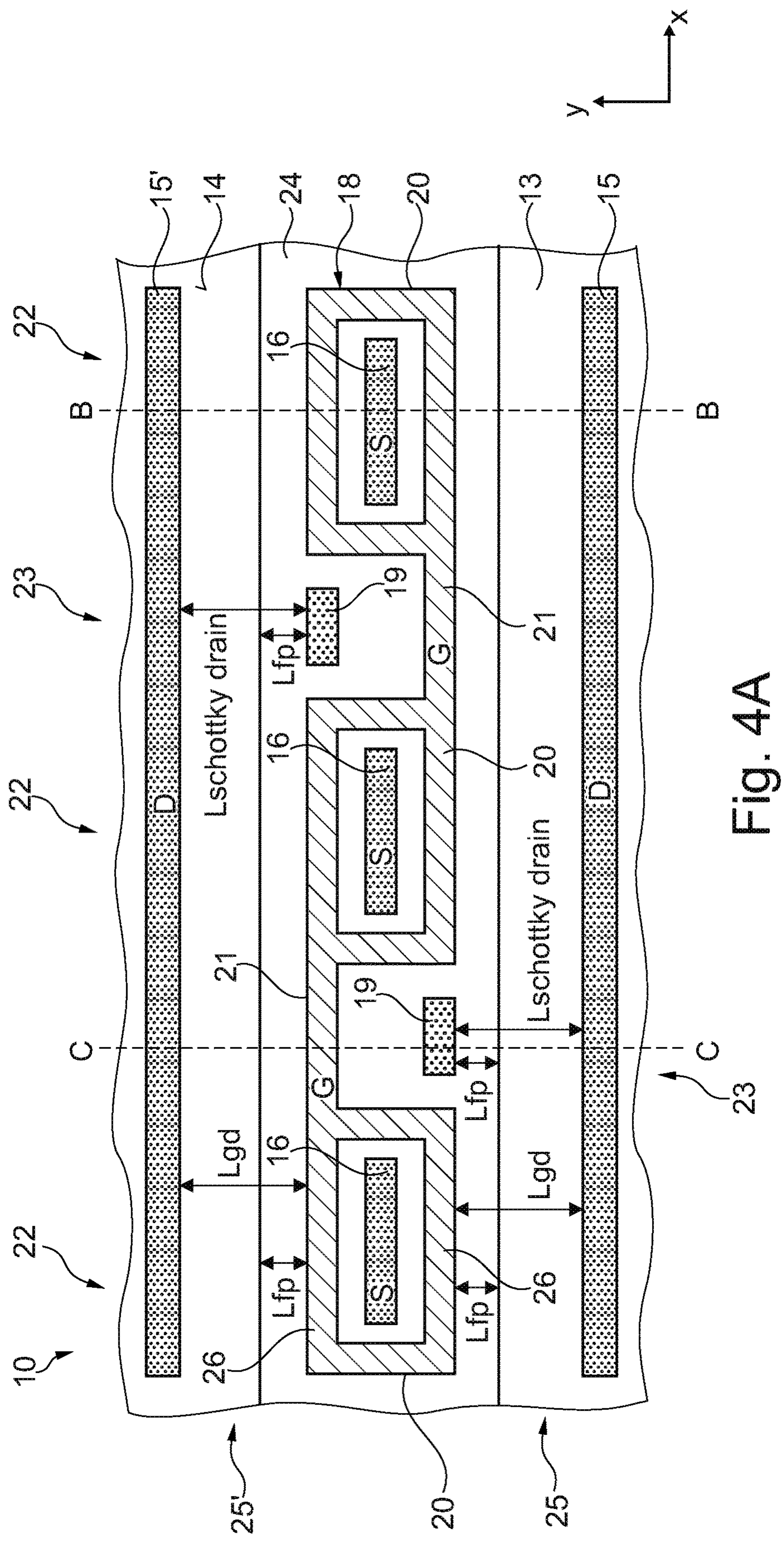
FIGS. 4A to 4E illustrate a semiconductor device according to an embodiment, where
Figure 4B:
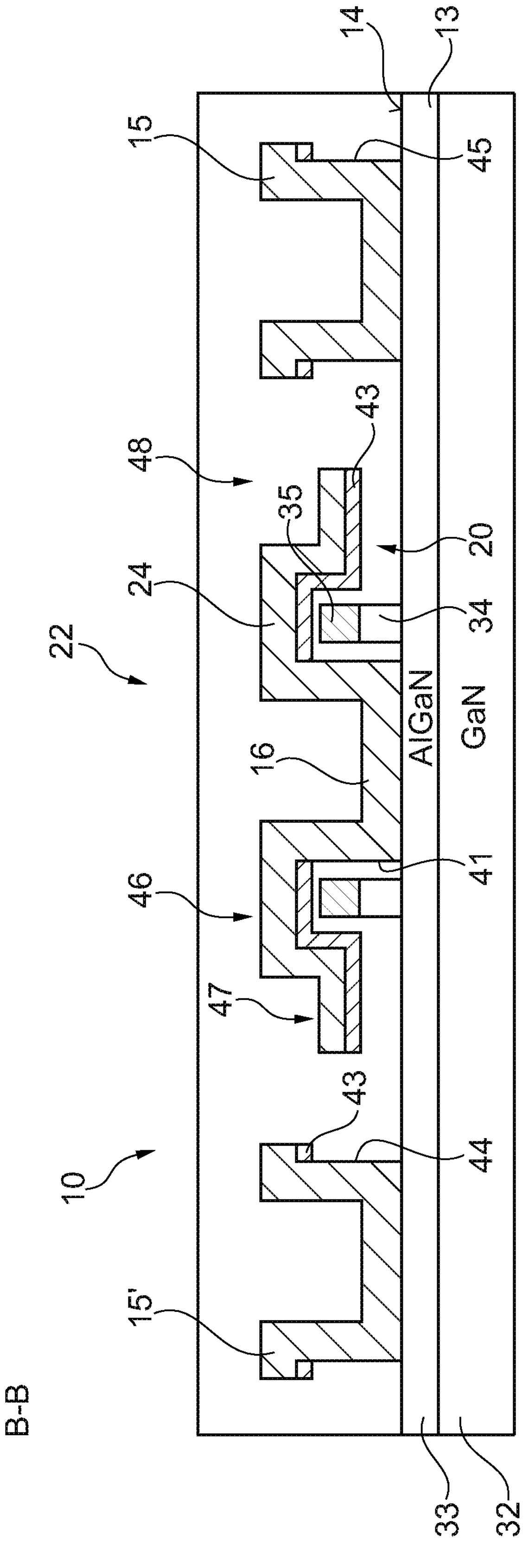

FIG. 4A illustrates a top view of two cells 25, 25' of a semiconductor device 10. Each cell 25, 25' has a plurality of transistor device sections 22 and a plurality of Schottky barrier diode sections 23. The cells 25, 25' share row of source contacts 16 which are arranged on the centreline 17 and parallel to common drain/cathode fingers 15, 15' and include a gate electrode structure 18 having the top layout illustrated in FIG. 3A. FIG. 4B illustrates a cross-sectional view along line B-B and FIG. 4C a cross-sectional view along line C-C shown in FIG. 4A.

The gate electrode structure 18 includes closed ring sections 20, one for each source contact 16, which are connected together by a connection region 21 which is positioned directly on the upper surface 14 of the Group III nitride body 13 and which is displaced in the Y direction from the centreline 17. Adjacent ones of the gate connection sections 21 are offset in opposing directions, in the Y direction, from the centreline 17.

In contrast to the embodiment illustrated in FIG. 3A, the Schottky contacts 19 are also displaced from the centreline 17 in the Y direction, whereby the Schottky contact 19 and the gate connection region 21 positioned in the Schottky diode section 23 are positioned on opposing sides of the centreline 17. Neighbouring ones of the Schottky contacts 19 are arranged on opposing sides of the centreline 17. Consequently, the number of Schottky diode sections 23 for each common drain/cathode finger is reduced over the arrangements illustrated in FIGS. 1A to 3 and only alternate gate connection sections 21 form a Schottky diode with one of the drain/cathode fingers 15, 15' In this embodiment, the distance $L_{fp}$ between the Schottky contact 19 and the edge of the ohmic metal layer 24 is substantially the same as the distance Lfp between the side portion 26 of the closed ring section 20 and the edge of the ohmic metal layer 24.

FIG. 4B illustrates a cross-sectional view along the line B-B and illustrates a cross-sectional view of the transistor section 22 of the semiconductor device 10. FIG. 4B illustrates that the source contact 16 is integral with the ohmic metal layer 24. Furthermore, the common drain/cathode fingers 15, 15' are also formed by a section of a metal layer and have a form that is substantially the same as that of the source contacts 16. The drain/cathode fingers 15, 15' may be fabricated from the deposited layer or layers that are used to from the ohmic metal layer 24 by suitable structuring of the deposited layer. For example, after deposition of the electrically insulating layer 36, stripe openings 44, 45 can be formed for the drain/cathode fingers 15, 15' in addition to the openings 41, 42 for the source contacts 16 and Schottky contacts 19. The ohmic metal layer 24 is then deposited into the openings 44, 45 as the same time as it is deposited into the opening 41, 42. The deposited layer may be then structured to remove portions arranged on the top surface of the electrically insulating layer to separate the drain/cathode fingers 15, 15' from the source contacts 16 and Schottky contacts 19 and ohmic metal layer 24. In other embodiments, the drain finger 15 and/or the source contact 16 may be formed by a metal layer which is separate from the ohmic metal layer 24.

In this embodiment, the ohmic metal layer 24 is not planar but has a raised upper section 46 that is positioned above the gate connection structure 18 and a lower section 47 that is arranged laterally adjacent the gate connection structure 18 at its peripheral edge. The lower section 47 is positioned at a smaller distance from the first major surface 14 of the Group III nitride body than the upper section 46. This arrangement may be used to form a field plate structure 48 in the ohmic metal layer 24.

Figure 4C:
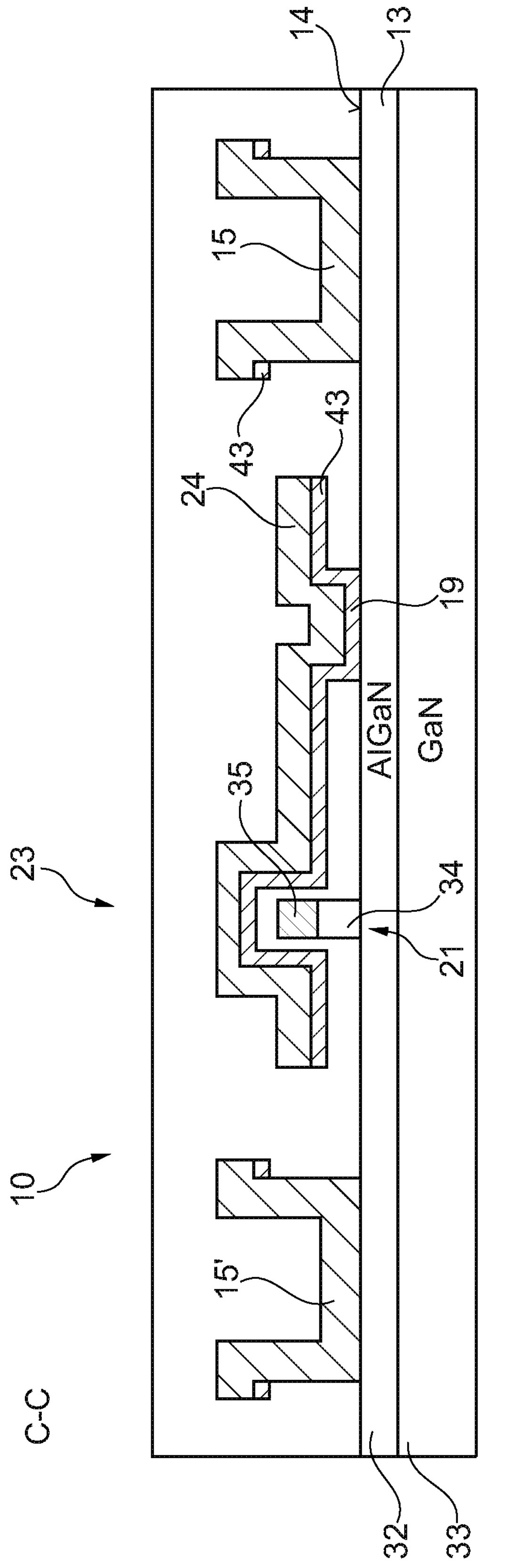

FIG. 4C illustrates a cross-sectional view along the line C-C and through the Schottky barrier diode section 23 of the semiconductor device 10. In this embodiment, the Schottky contact 19 is integral with a layer of a Schottky metal 43 which forms the lower sublayer of the ohmic metal layer 24. The Schottky layer 43 and the ohmic metal layer 24 may have substantially the same lateral extent. However, in other embodiments, the Schottky contact 19 may be formed by a discrete island comprising a Schottky metal and the ohmic metal layer 24 is formed of an ohmic metal such that the Schottky metal layer 43 no longer extends over the entire lateral area of the metal layer 24.

Figure 4D:
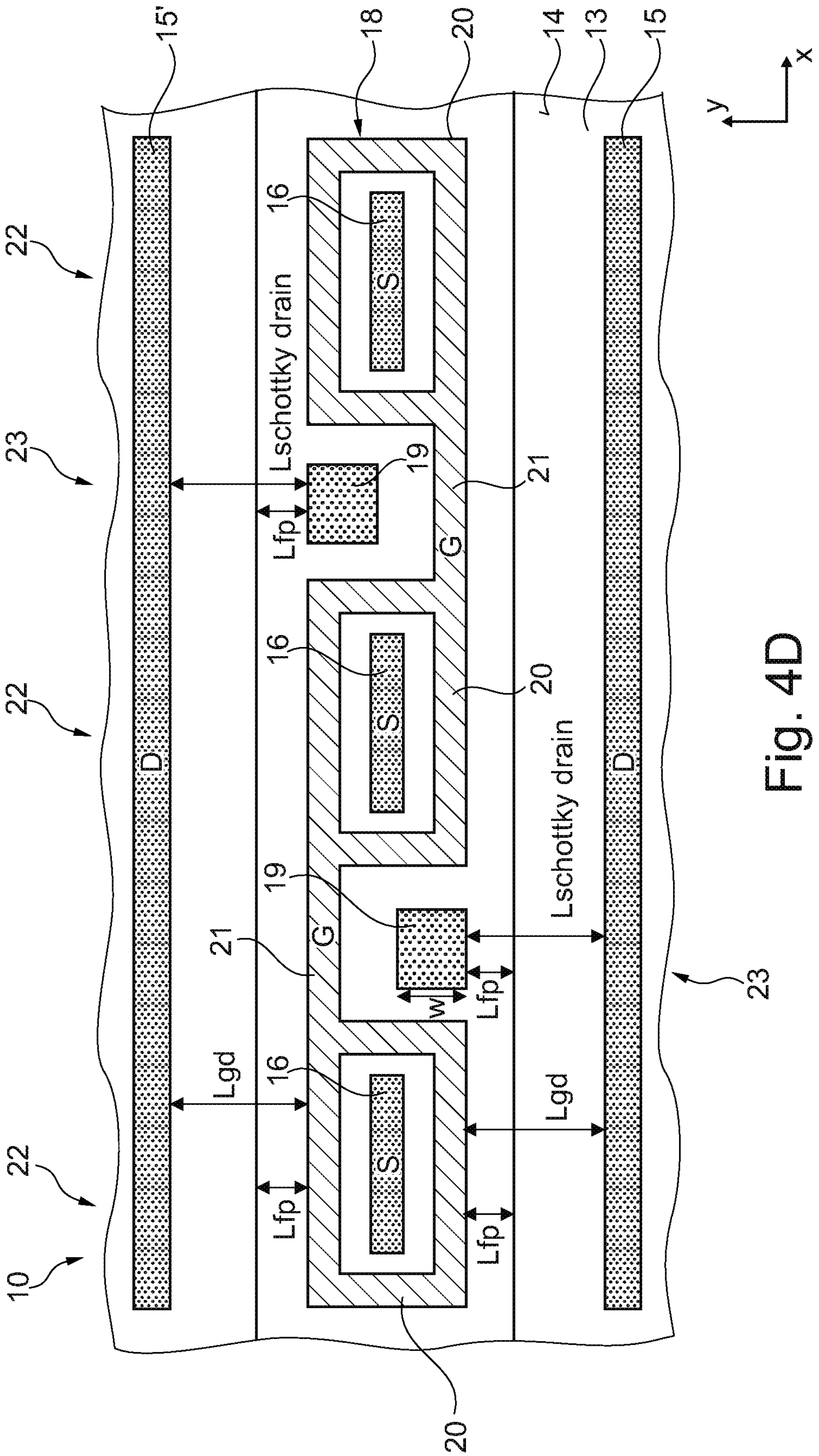

FIG. 4D illustrates a top view of a semiconductor device 10 having an arrangement of the gate electrode structure 18 and Schottky contacts offset in the Y direction from the centreline 17 as illustrated in FIG. 4A. The semiconductor device 10 of this alternative embodiment differs from that illustrated in FIG. 4A in the width w of the Schottky contact opening 43 in the Y direction. In this embodiment, the width of the Schottky contact 19 in the Y direction is approximately the same as is length in the X direction. The Schottky contact 19 is, however, still displaced from the centreline 17 in the Y direction and the distance LSchottky-drain and Lgd are substantially the same.

Figure 4E:
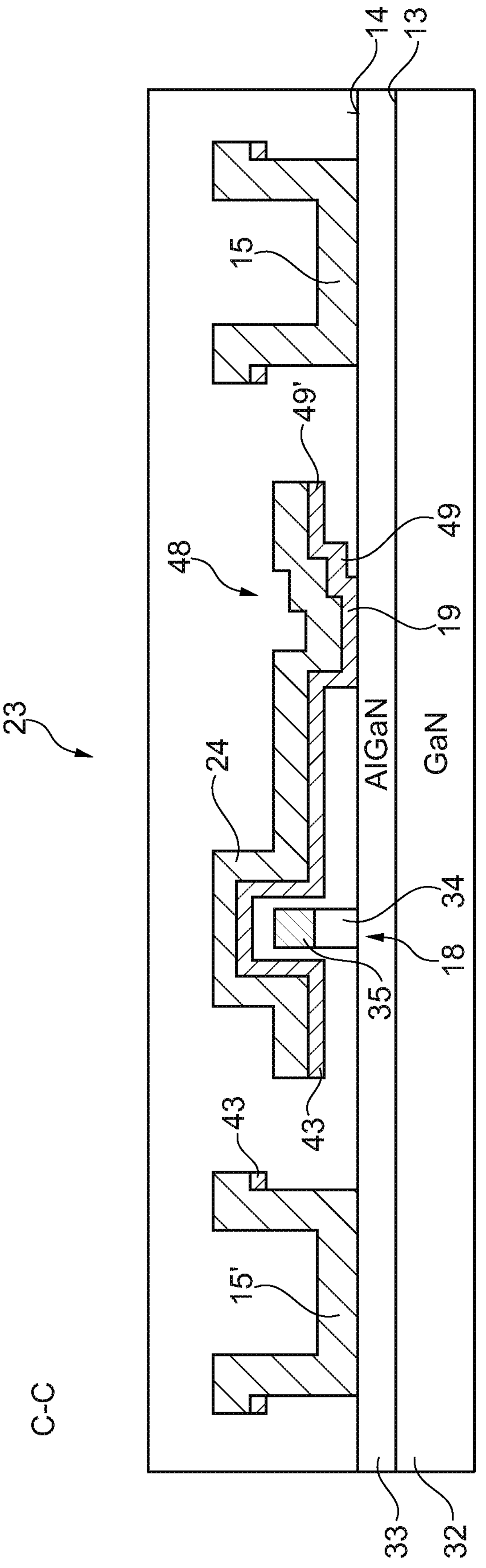

FIG. 4E illustrates a cross-sectional view along the Schottky barrier diode section 23 corresponding to the line C-C shown in FIG. 4A of a semiconductor device having a top layout as illustrated in FIG. 4A. In this embodiment, the ohmic metal layer 24 includes a field plate structure 48 with two field plates 49, 49'. The dual field plate structure 48 extends towards the drain/cathode finger 15 which together with the Schottky contact 19 forms the diode section 23. The first field plate 49 is formed by an extension which is arranged above and spaced apart from the upper surface 14 of the Group III nitride body 13 and which extends in the Y direction towards the drain/cathode finger 15. The second field plate 49' extends from the first field plate structure 49 and is spaced at a greater distance from the upper surface 14 of the Group III nitride body 13 than the first field plate 49 and also extends in the Y direction towards the cathode finger 15.

Figure 5:
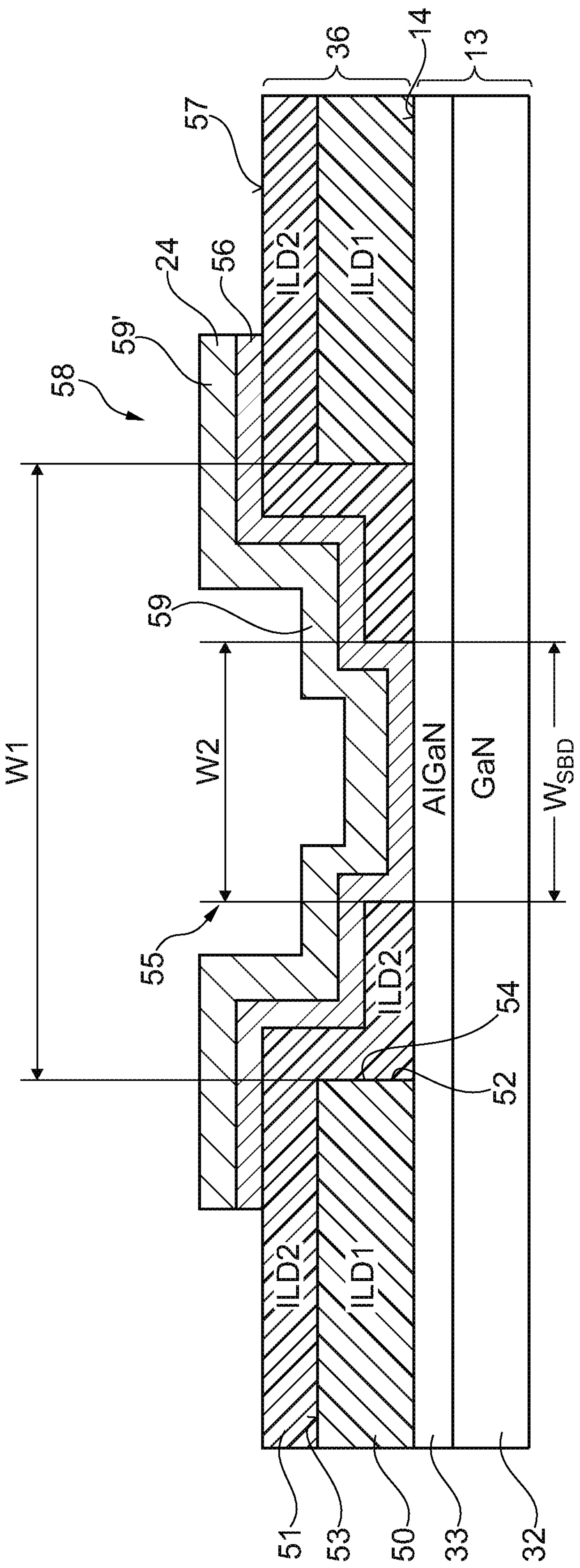
FIG. 5 illustrates a cross-sectional view of a Schottky contact.

FIG. 5 illustrates a cross-sectional view of a Schottky contact 19 including a field plate structure 58 which may be used in the semiconductor device of any one of the embodiments described herein. The field plate structure 58 includes two field plates 59, 59' which extend outwardly on two opposing sides. The electrically insulating layer 36 is formed of two sublayers 50, 51. The first sublayer 50 is arranged on the upper surface 14 of the Group III nitride body 13 and is structured to form an opening 52 having a width W1 which is greater than the width $W_{SBD}$ of the Schottky contact 19. The second electrically insulating sublayer 51 extends over the upper surface 53 of the first sublayer 50 and on the side faces 54 of the opening 52 and over the upper surface 14 of the Group III nitride body 13 which is exposed within the opening 52. The second sublayer 51 itself includes an opening 55 exposing a portion of the Group III nitride body 13. The opening 55 has a width W2 which is less than the width W1 of the opening in the first sublayer 50. The width W2 corresponds to the width $W_{SBD}$ of the Schottky contact 19.

The second sublayer 51 is conformal with the first sublayer 50 such that an opening is formed with a step on the two opposing sides. The Schottky contact is formed by depositing a Schottky metal layer 56 which extends over the upper surface 57 of the second dielectric layer 51 the step of the second sublayer 51 and the exposed portion of the Group III nitride body 13 to form a Schottky contact 19 at the base of the opening 55. The lateral extent of the Schottky metal layer 56 on the upper surface 57 of the second sublayer 51 is defined to form a field plate structure 58 having two filed plates, a first field plate 59 is formed on the step of the opening and a second field plate 59' is formed on the upper surface 57 of the second sublayer 51. The first and second field plates 59, 59' are spaced at an increasing distance from the upper surface 14 of the Group III nitride body 13. An ohmic metal layer 24 is arranged on top of the Schottky layer 56. Thus, the Schottky contact 19 has two field plates on two opposing sides.

The Schottky diode 19 illustrated in FIG. 5 is more robust in respect to high fields (low leakage currents) is provided. The first electrically insulating sublayer 50 may have a thickness of 10 nm to 30 nm and may be deposited by e.g. ALD. Then a second contact opening within the first opening is performed before the deposition of the Schottky metal. The distance between the second and first contact opening 52, 55 forms a field plate 59 with the Schottky metal.

A method of forming the source contact 16 and Schottky contact 19 for use in the semiconductor device according to any one of the embodiments described herein and for electrically connecting the source contact 16 and Schottky contact 19 together using the ohmic metal layer 24 will be described with reference to FIGS. 6A through 6E. The method will be illustrated with reference to a cross-sectional view along the centreline 17 of the arrangement illustrated in FIG. 3A but may be used for other arrangements of source contacts 16 and Schottky contacts 19 including those described herein. The method is not limited to designs having a gate electrode structure 18 with closed rings sections and gate connection sections and may be used for forming and electrically connecting source contacts and/or Schottky contacts in other types of semiconductor devices including Group III nitride devices, for example a Group III nitride HEMT with Schottky barrier diode (SBD), which have differing arrangements of the gate electrode structure including an elongate straight strip-like gate electrode.

Figure 6A:
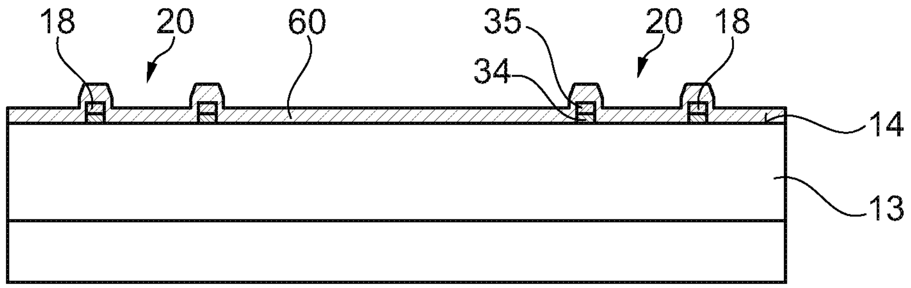
FIGS. 6A to 6E illustrate a method of forming a source contact and a Schottky contact and for electrically connecting them.
Figure 6B:
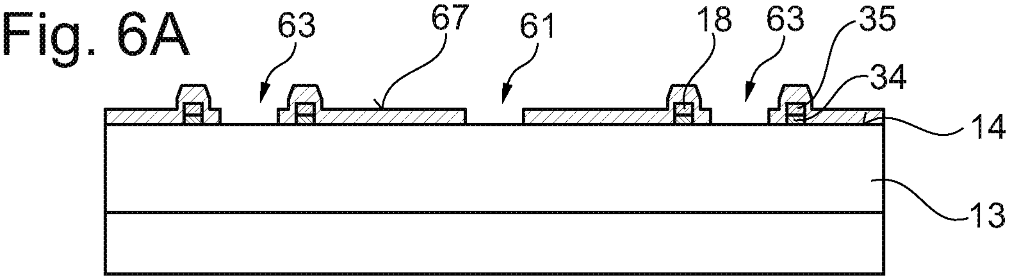
Figure 6C:
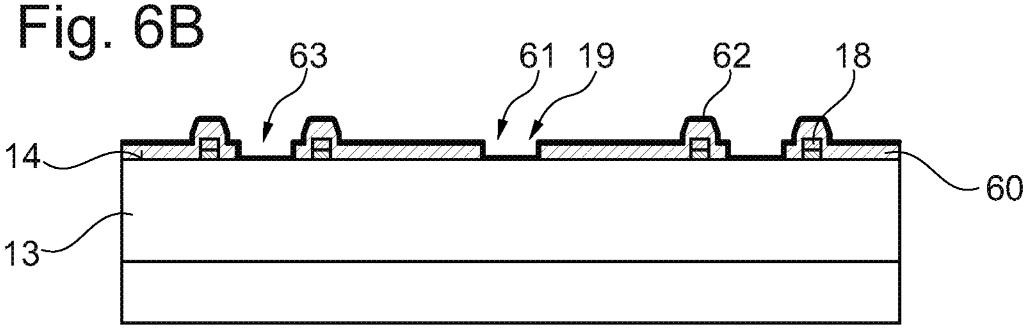

Referring to FIG. 6A, the gate electrode structure 18 is first formed on the first surface 14 of the Group III nitride body 13. The gate electrode structure 18 includes a p doped Group III nitride layer 34, for example p doped gallium nitride, and a gate metal layer 35 which is arranged on the p doped Group III nitride layer 34. This structure for the gate electrode structure 18 provides an enhancement mode device which is normally off. In other embodiments, the p-doped Group III nitride layer is omitted and the gate electrode structure 18 includes a gate metal layer 35 only and provides a depletion mode device which is normally on. In the cross-sectional view of FIGS. 6A through 6E, two ring portions are shown. The gate electrode structure 18 is covered with a first electrically insulating layer 60, which may, for example, be formed of silicon nitride. As can be seen in FIG. 6B, an opening 61 is formed in the electrically insulating layer 60 that exposes a region of the first major surface 14 of the Group III nitride body 13 at a position in which the Schottky contact is to be formed. The lateral size of the opening 61 corresponds to the contact area desired between the Schottky contact 19 and the underlying Group III nitride body 13. An opening 63 is also formed in the electrically insulating layer 60 that exposes a region of the first major surface 14 of the Group III nitride body 13 at a position in which a source contact is to be formed. The lateral size of the opening 63 may correspond to the contact area desired between the source contact 16 and the underlying Group III nitride body 13.

Figure 6D:
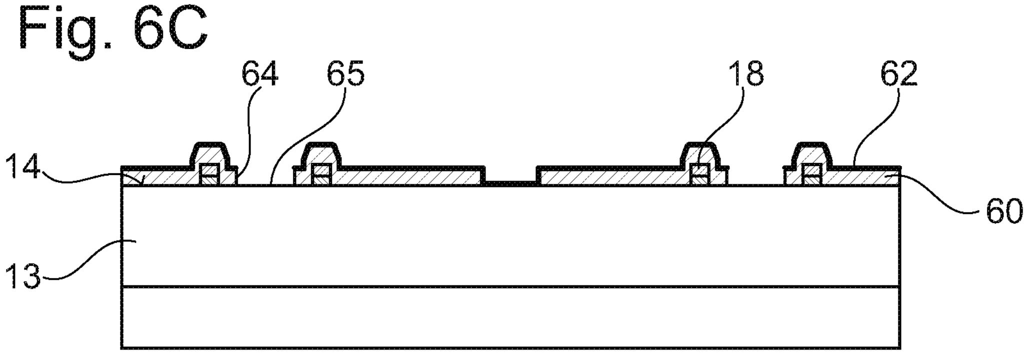

As is illustrated in 6C, a layer 62 of a Schottky metal is then deposited which conformally covers the upper surface of the first insulating layer 60, the side walls of the opening 61 and the region of the Group III nitride body 13 that is exposed at the base of the opening 61 so as to form a Schottky contact between the layer 62 and the Group III exposed region of the Group III nitride body 13. As illustrated in FIG. 6D, selected portions of the Schottky metal layer 62 and electrically insulating layer 60 are removed at positions which are to form the source contacts. An opening 64 is formed in the electrically insulating layer 60 that is positioned at the centre of the closed ring section 20 of the gate connection structure 18. A region 65 of the Group III nitride body 13 lies exposed at the base of the opening 64

Figure 6E:
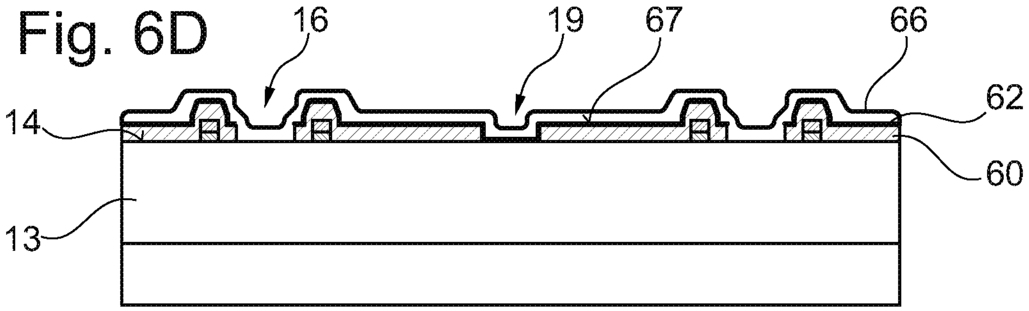

As illustrated in FIG. 6E, one or more ohmic metal layers 66 are then deposited which cover the Schottky metal layer 62 which is positioned in the opening 61 as well as which covers the remainder of the upper surface 67 of the insulating layer 60 and which also is in contact with the region 65 of the Group III nitride body 13 exposed in the opening 64 so as to provide an ohmic contact between the metal layer 66 and the Group III nitride body 13 and to form a source contact 16 that is integral with the ohmic metal layer 24. The source contact 16 is electrically connected to the Schottky contact 19 formed in the opening 61 by the ohmic metal layer 66. The lateral extent of the deposited layers 62, 66 on the upper surface of the electrically insulating layer 60 is then defined to form the ohmic metal layer 24.

A space optimized and layer optimized Schottky/ohmic contact sequence is formed using this method The Schottky metal layer 62 may comprise two or more sublayers, for example TiN, W, etc. For the ohmic source contact 16, the Schottky metal 62 and the passivation 60 is removed to expose the surface 14 of the Group III nitride body 13. After cleaning the exposed AlGaN surface of the etch residuals, the ohmic metal layer 66 or multilayer stack such as Ti/Al/Ti is deposited within the openings 63 for the ohmic source contact 16 and on top of the Schottky metal layer 62 so as to electrically connect the source contacts 16 and Schottky contacts 19.

In the embodiments described with reference to and illustrated in FIGS. 1A to 5, a gate electrode structure 18 was provided in a single plane in which a continuous conductive path along the entire length of the common drain/cathode electrode 15 provided. The entire gate electrode structure 18 including the p doped Group III nitride layer 34 and gate metal layer 35 extends along and is in direct contact with the upper surface 14 of the Group III nitride body 13 in the X direction through the Schottky sections 23, although the gate connection section 21 in the Schottky section 23 does not form part of the Schottky diode device formed in the Schottky section 23.

Figure 7A:
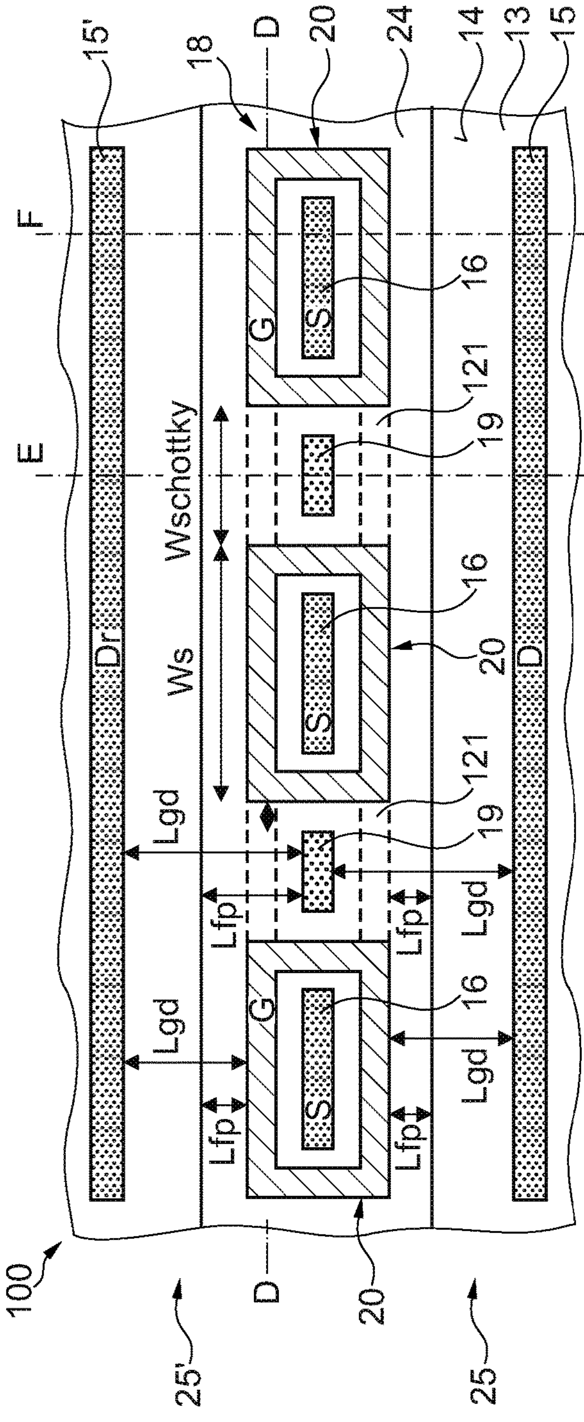
FIGS. 7A to 7D illustrates a semiconductor device with a gate connection structure located in two planes according to an embodiment, where

In other embodiments, a gate electrode structure 18 is provided which is positioned in two different planes. Referring to FIG. 7A, similar to the embodiment illustrated in FIG. 3A, the semiconductor device 100 includes a plurality of source contacts 16 which are arranged on the centreline 17 and a plurality of Schottky contacts 19 which are also arranged on the centreline 17 and which are alternately arranged with the source contacts 16 along the centreline 17. Each of the source contacts 16 is also laterally surrounded by a continuous closed section 20 of the gate connection structure 18. Two cells 25, 25' of the semiconductor device 100 having common source contacts 16 and common Schottky contacts 19 on the centerline 17 are shown. Each cell 25, 25' comprises a Group III nitride transistor device 11 provided by the plurality of transistor sections 22 and a Schottky barrier diode 12 provided by the plurality of Schottky barrier sections 23.

Figure 7B:
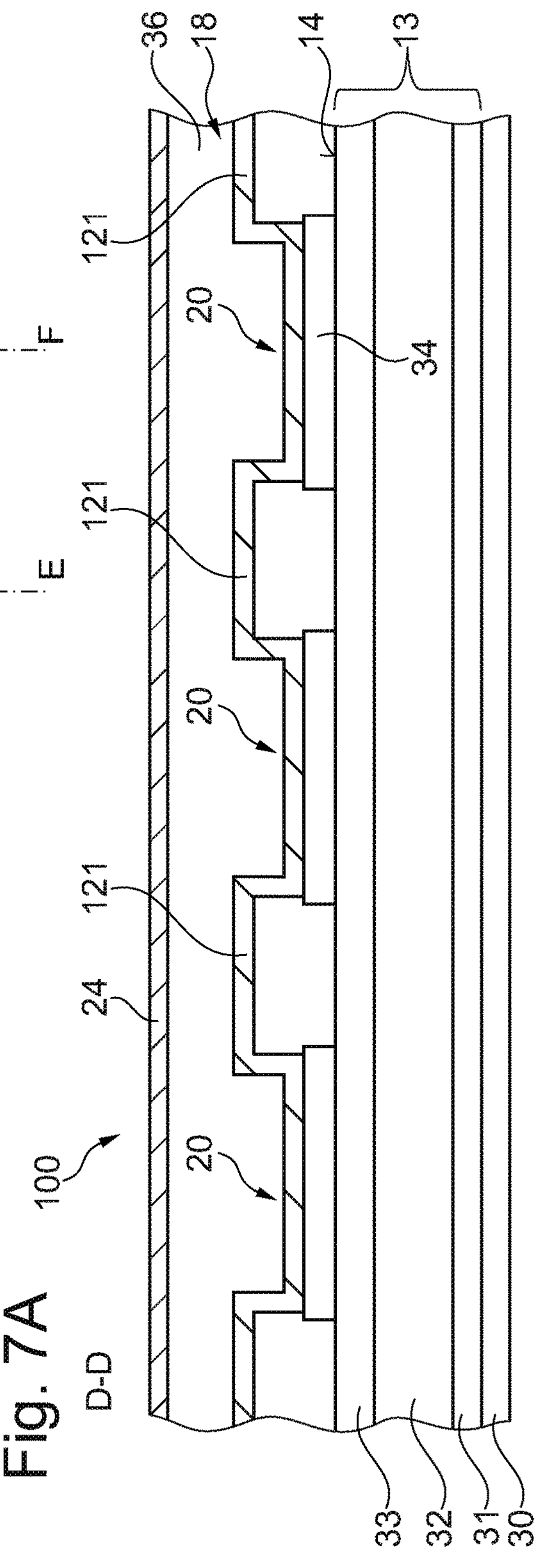
Figure 7C:
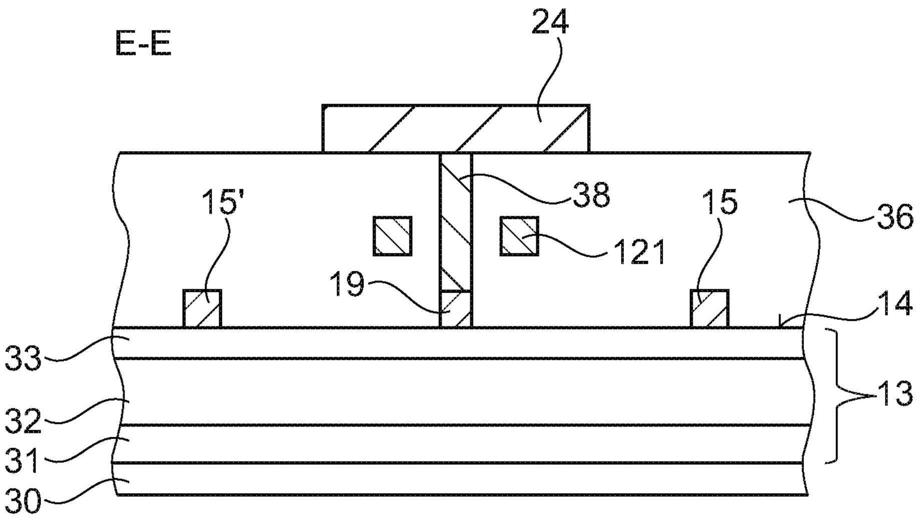
Figure 7D:
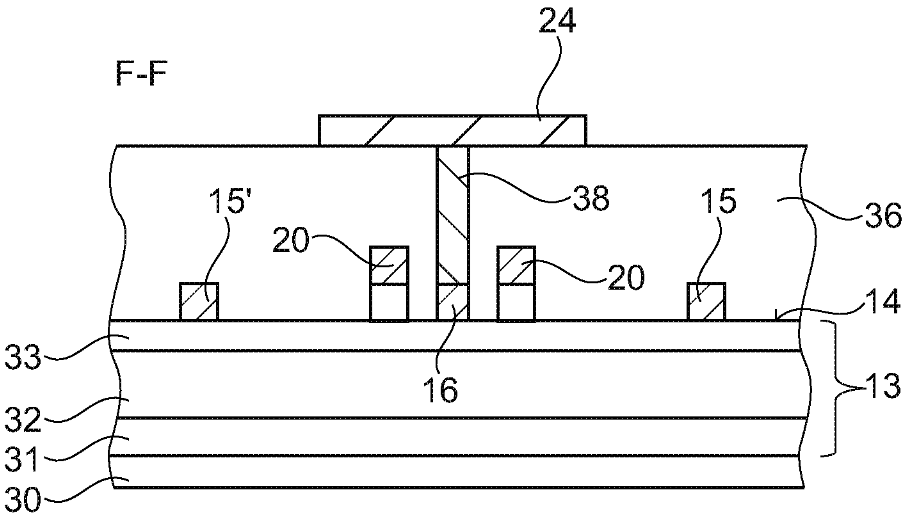

FIG. 7B illustrates a cross-sectional view along the line D-D and illustrates a cross-sectional view of the gate connection structure 18. FIG. 7C illustrates a cross-sectional view along the line E-E and illustrates a cross-sectional view of the Schottky section 23 and FIG. 7D illustrates a cross-sectional view along the line F-F and illustrates a cross-sectional view of the transistor section 22.

In this embodiment, the closed ring sections 20 are electrically connected together by a gate connection section 121 which is positioned in a different plane from the closed ring sections 20 and which is positioned in a second plane spaced above the first plane of the upper surface 14 of the Group III nitride body 13. As can be seen from the cross-sectional view of FIG. 7B, in some embodiments the gate connection section 121 extends in a plane spaced above the first surface 14 of the Group III nitride body 13 and which is laterally displaced from the centreline in the Y direction as is indicated by the dotted lines in the top view of FIG. 7A. The ohmic metal layer 24 which electrically connects the source contacts 16 and Schottky contacts 19 to one another is positioned in a third plane which lies above the second plane in which the gate connection sections 21 are positioned. The gate connection section 121 may also extend continuously in the second plane and parallel to the common drain/cathode fingers 15, 15'.

The gate connection section 121 may be formed of the gate metal 35 only, whereas the closed ring sections 20 include the p-doped Group III nitride layer 34 that it is direct contact with the first surface 14 of the Group III nitride body 13. The gate metal 35 is positioned on the p-doped Group III nitride layer 34 of the closed ring sections and is connected to the connection sections 121 by conductive vias 122. The conductive vias 122 may be integral with the gate connection sections 121 and gate metal 35 of the closed ring sections 20.

The arrangement of the gate connection sections 121 in a second plane that is different from the plane in which the closed ring sections 20 are positioned may be used for semiconductor devices with other type of top layouts that differ from that illustrated in FIG. 7A.

Figure 8A:
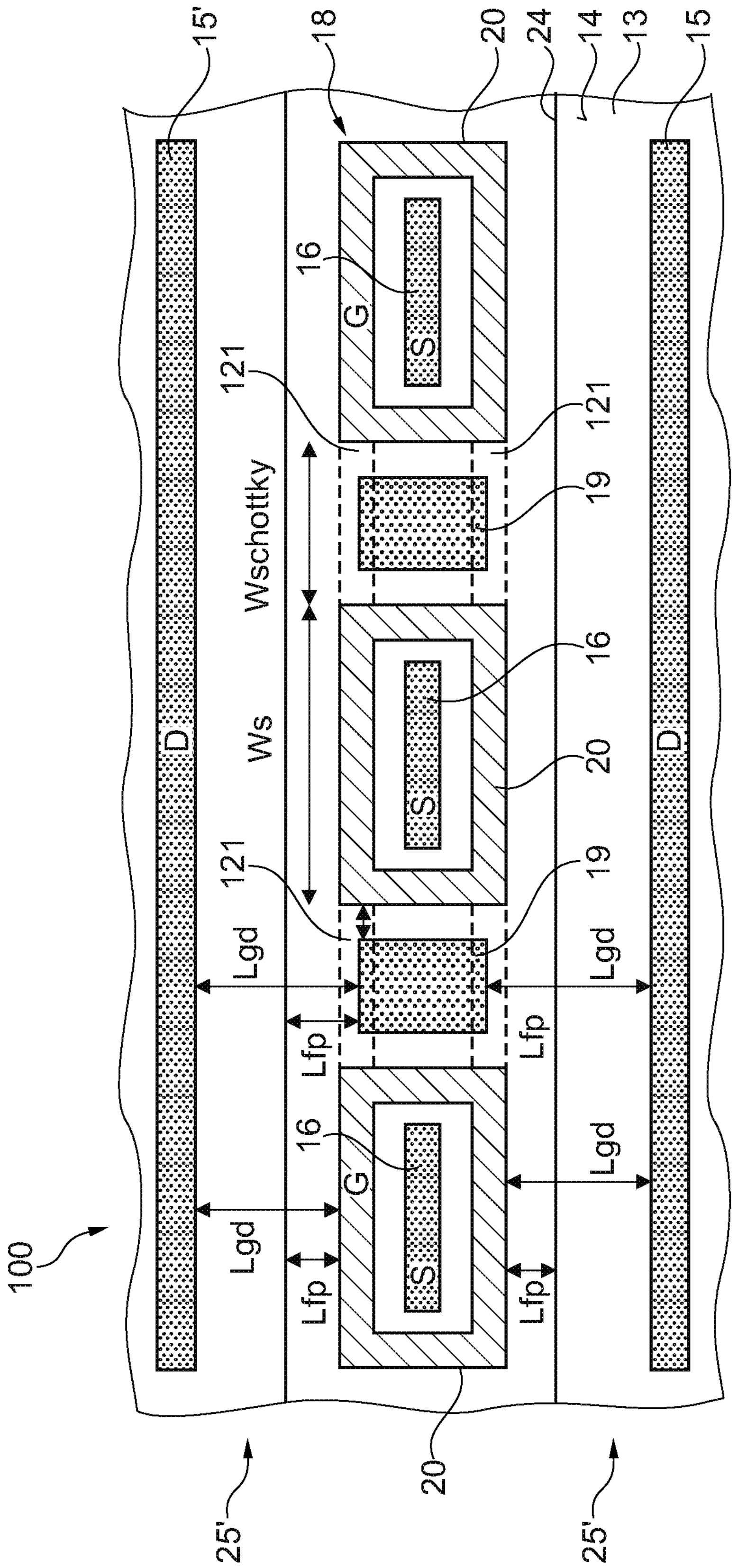
FIGS. 8A and 8B illustrate transistor devices with a gate connection structure located in two planes.
Figure 8B:
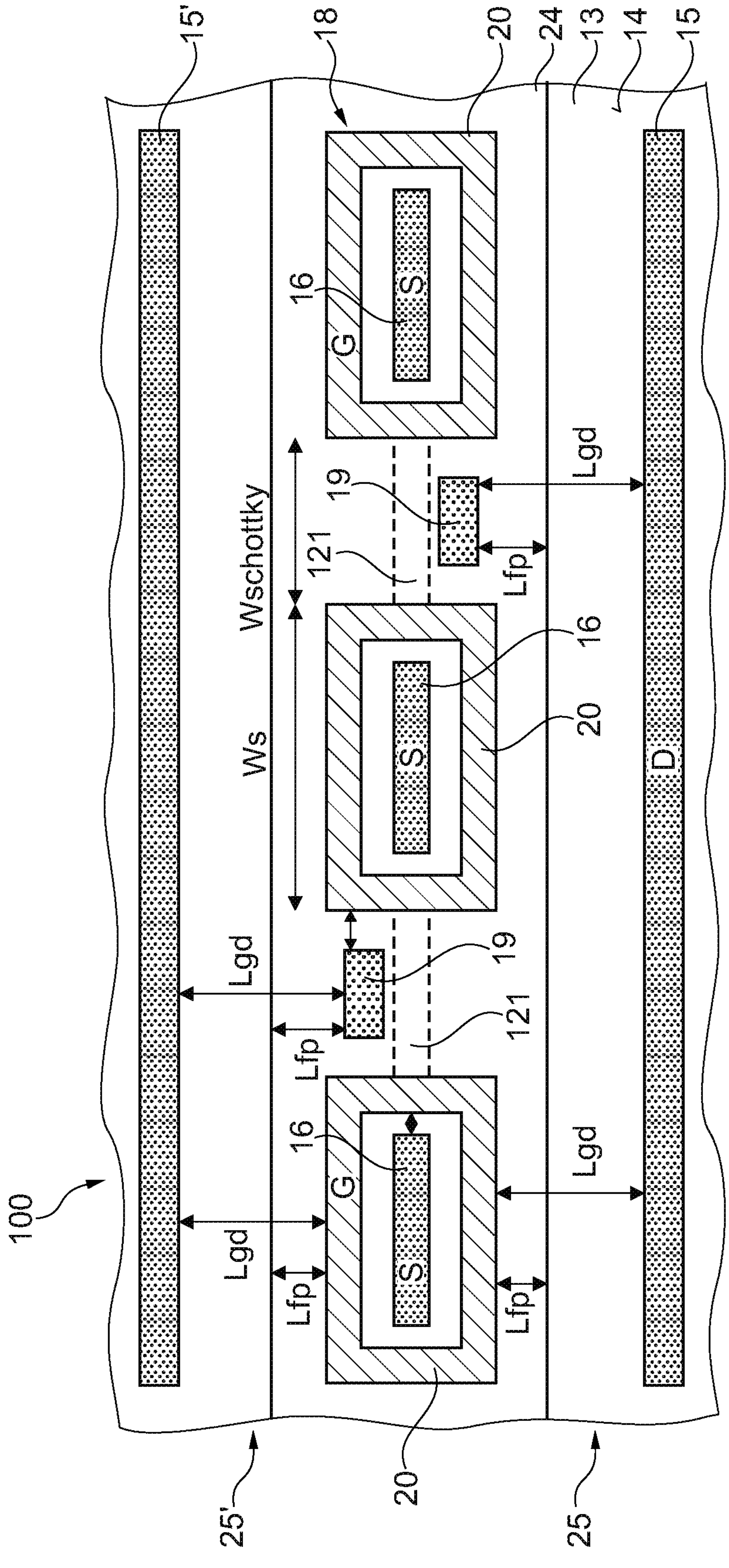

For example, FIG. 8A illustrates an arrangement in which, compared to the semiconductor device 100 of FIGS. 7A through 7D, the Schottky contact 29 has a larger contact area and is positioned on the centreline 17. FIG. 8B illustrates an embodiment in which the Schottky contacts 19 are displaced in the Y direction from the centreline 17 whereby adjacent ones of the Schottky contacts are offset in opposing directions in the Y direction. In this embodiment, the gate connection section 121 arranged in the second plane may extend along the centreline 17. Two cells 25, 25' of the semiconductor device 100 having common source contacts 16 on the centerline 17 are shown in FIGS. 8A and 8B. Each cell 25, 25' comprises a Group III nitride transistor device 11 provided by the plurality of transistor sections 22 and a Schottky barrier diode 12 provided by the plurality of Schottky barrier sections 23. In the embodiment of FIG. 8A, the Schottky contacts 19 are arranged on the centerline 17 and are common to both cells 25, 25'. In the embodiment of FIG. 8B, the Schottky contacts 19 are offset form the centerline 17 and not common to both cells 25, 25'. Alternative ones of the Schottky contacts belong to one of the cells only.

The semiconductor device 10, 100 comprises a plurality of cells 25, 25' that are electrically coupled in parallel, each cell 25 comprising a drain finger 15, a source structure 16 and a gate structure 18. In some embodiments, all of the cells 25, 25' have an interrupted source finger and a Schottky barrier diode and include a plurality of transistor sections 22 and Schottky barrier diode sections 23 that are interdigitated.

In some embodiments, the semiconductor device comprises one or more cells, which comprises a drain finger, a source structure and a gate structure. However, the source structure has the form of an uninterrupted source finger, i.e. a single source contact is provided. The source finger is, therefore, continuous. This type of cell does not include a Schottky barrier diode and provides only a transistor device. Both types of cells are electrically coupled in parallel, for example by a drain bus, source bus and gate bus.

The number of cells with a transistor device and Schottky barrier diode and their distribution amongst cells having a transistor device and no Schottky barrier diode may vary and may be selected depending on the desired rating of the Schottky barrier diode in relation to the rating of the transistor device provided by the transistor device sections of the cells with an interrupted source finger and the transistor devices formed by the cells having an uninterrupted source finger.

Figure 9C:
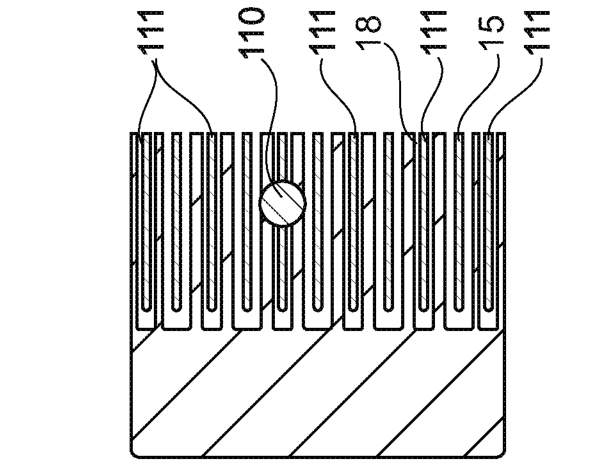
FIGS. 9A to 9C illustrate three alternatives for locating an interrupted source finger.
Figure 9B:
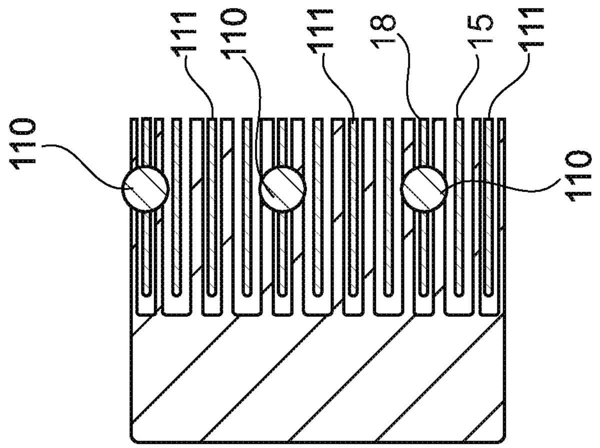
Figure 9A:
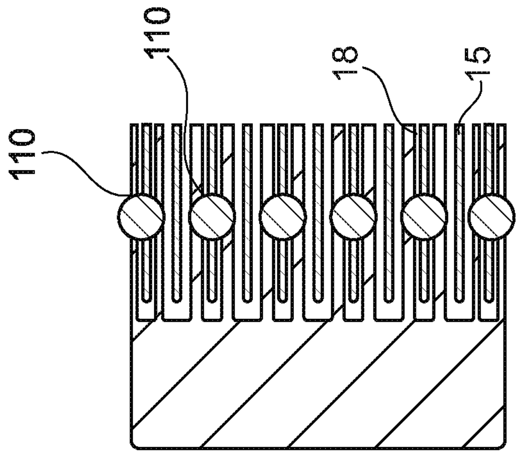

FIGS. 9A to 9C illustrate three alternatives for locating an interrupted source finger, indicated with the circle 110, which includes two or more source contacts and at least one Schottky contact so as to provide at least one Schottky section and at least one transistor section in a common Group III nitride body 13. Any one of the embodiments described herein may be used.

In FIG. 9A, each of the source fingers 110 includes one or more Schottky barrier sections. In FIG. 9B every second source finger 100 includes Schottky barrier sections and the remainder of the source fingers 11 are uninterrupted and continuous and without Schottky barrier diode sections. Fewer than half of the source fingers may be interrupted. In in FIG. 9C, only one of the illustrated source fingers 110 includes a Schottky barrier section with the remaining five source fingers 111 being uninterrupted and continuous and without Schottky barrier diode sections.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a Group III nitride transistor device and a Schottky barrier diode integrated in a Group III nitride body, the semiconductor device comprising:

a common drain/cathode finger arranged on a first major surface of the Group III nitride body;

two or more source contacts arranged on the first major surface of the Group III nitride body and spaced apart in a row, the row being spaced laterally apart from, and extending substantially parallel to, the common drain/cathode finger;

a gate electrode structure arranged on the first major surface of the Group III nitride body; and one or more Schottky metal contacts arranged on the first major surface of the Group III nitride body, at least one Schottky metal contact being arranged between and spaced apart from neighbouring ones of the source contacts, wherein the gate electrode structure comprises a closed ring section for each source contact that laterally surrounds that source contact, wherein neighbouring closed ring sections are connected by a gate connection section.

2. The semiconductor device of claim 1, wherein the source contacts are electrically coupled to one another and to the one or more Schottky metal contacts by an ohmic metal layer.

3. The semiconductor device of claim 2, wherein the source contacts are integral with the ohmic metal layer and the ohmic metal layer has sections that are positioned on the first major surface of the Group III nitride body to form the row of two or more source contacts to the Group III nitride body, extends over the gate structure and onto the one or more Schottky metal contacts.

4. The semiconductor device of claim 1, wherein the one or more Schottky metal contacts is arranged on the first major surface of the Group III nitride body laterally between the gate connection section and the common drain/cathode finger.

5. The semiconductor device of claim 1, wherein:

the gate connection section is aligned with the row of source contacts and the one or more Schottky metal contacts is laterally displaced from the row towards the common drain/cathode finger; or the gate connection section is laterally displaced from the row towards the common drain/cathode finger and the one or more Schottky metal contacts is aligned with the row; or the gate connection section and the one or more Schottky metal contacts are laterally displaced from the row towards the common drain/cathode finger.

6. The semiconductor device of claim 1, wherein:

two Schottky contacts are positioned on opposing sides and laterally spaced apart from the gate connection section; or two or more Schottky contacts are provided, neighbouring ones of the two or more Schottky contacts being arranged on opposing sides of the row of source contacts and laterally spaced apart from neighbouring gate connection sections.

7. A semiconductor device, comprising a plurality of cells that are electrically coupled in parallel, each cell comprising a drain finger, a source structure, and a gate structure, wherein one or more of the cells comprises the semiconductor device of claim 1.

8. The semiconductor device of claim 7, wherein one or more of the cells comprises a source structure comprising an uninterrupted source finger.

9. A semiconductor device comprising a Group III nitride transistor device and a Schottky barrier diode integrated in a Group III nitride body, the semiconductor device comprising:

a common drain/cathode finger arranged on the Group III nitride body;

a gate electrode structure arranged on the Group III nitride body;

an ohmic metal layer that has two or more sections that are positioned on the Group III nitride body and are spaced apart in a row that is laterally spaced apart and extend substantially parallel to the common drain/cathode finger, each section forming a source contact to the Group III nitride body; and one or more Schottky metal contacts, at least one Schottky metal contact being arranged on the Group III nitride body between and spaced apart from neighbouring ones of the source contacts, wherein the ohmic layer further extends over and is electrically insulated from the gate electrode structure and extends onto the one or more Schottky metal contacts so as to electrically couple the two or more source contacts and the one or more Schottky contacts to one another.

10. The semiconductor device of claim 9, wherein the ohmic metal layer has a lateral extent that is greater than a lateral extent of the source contacts such that the ohmic metal layer further forms a field plate, and wherein a distance between the field plate and the common drain/cathode finger is less than the shortest distance between the gate structure and the common drain/cathode finger.

11. The semiconductor device of claim 9, wherein the one or more Schottky metal contacts further comprises a field plate that extends over and is electrically insulated from the gate electrode structure.

12. The semiconductor device of claim 9, further comprising an isolation region arranged in the gate electrode structure between neighbouring source and Schottky contacts.

13. A semiconductor device, comprising a plurality of cells that are electrically coupled in parallel, each cell comprising a drain finger, a source structure, and a gate structure, wherein one or more of the cells comprises the semiconductor device of claim 9.

14. The semiconductor device of claim 13, wherein one or more of the cells comprises a source structure comprising an uninterrupted source finger.

15. A method of fabricating a semiconductor device, the method comprising:

providing a Group III nitride body and at least one gate electrode structure on the Group III nitride body;

forming an insulation layer over the gate electrode structure;

forming one or more first openings and two or more second openings through the insulation layer that expose the Group III nitride body, the first and second openings being laterally spaced apart from the gate electrode structure and arranged alternately in a direction parallel to the gate electrode structure, forming a Schottky metal layer in the first opening to form a Schottky contact to the Group III nitride body;

forming an ohmic metal layer in the second openings to form ohmic source contacts to the Group III nitride layer and further forming the ohmic metal layer on the insulation layer and on the Schottky metal layer in the first opening to electrically connect the Schottky contact and the source contacts.

16. The method of claim 15, further comprising forming one or more third openings in the insulating layer and exposing the Group III nitride body, wherein the third opening is laterally spaced apart from the first and second openings and the second and third openings are arranged on opposing sides of the gate electrode structure, wherein the ohmic metal layer is further formed in the third opening to form an ohmic drain/cathode contact to the Group III nitride body.

17. The method of claim 15, further comprising:

forming a further insulation layer in the first openings and on the insulation layer;

forming a fourth opening in the first opening that has a lateral extent that is less than the lateral extent of the first opening and that exposes the Group III nitride body; and afterwards forming the Schottky metal layer in the fourth openings and on the further insulation layer to form a Schottky contact to the Group III nitride body that comprises a field plate structure.

18. The method of claim 15, wherein the gate finger comprises closed ring-shaped sections that are connected by a gate connection section, and wherein one second opening is formed within each ring-shaped section and the first opening is formed laterally adjacent the gate connection section.

* * * * *